United States Patent
Torrey

(10) Patent No.: US 10,995,409 B2
(45) Date of Patent: May 4, 2021

(54) METHOD AND APPARATUS FOR TRANSFER OF TWO-DIMENSIONAL MATERIALS

(71) Applicant: ETX CORPORATION, Saint Paul, MN (US)

(72) Inventor: Ethan R. Torrey, Saint Paul, MN (US)

(73) Assignee: ETX Corporation, Saint Paul, MN (US)

( * ) Notice: Subject to any disclaimer, the term of this patent is extended or adjusted under 35 U.S.C. 154(b) by 0 days.

(21) Appl. No.: 16/635,112

(22) PCT Filed: May 21, 2019

(86) PCT No.: PCT/US2019/033410
§ 371 (c)(1),
(2) Date: Jan. 29, 2020

(87) PCT Pub. No.: WO2019/226711
PCT Pub. Date: Nov. 28, 2019

(65) Prior Publication Data
US 2021/0047739 A1 Feb. 18, 2021

Related U.S. Application Data

(60) Provisional application No. 62/674,715, filed on May 22, 2018.

(51) Int. Cl.
*C23F 1/08* (2006.01)
*B05C 3/109* (2006.01)

(52) U.S. Cl.
CPC .............. *C23F 1/08* (2013.01); *B05C 3/109* (2013.01)

(58) Field of Classification Search
CPC .............. C23F 1/08; B05C 3/109; B05C 3/10
(Continued)

(56) References Cited

U.S. PATENT DOCUMENTS

| 5,391,257 A | 2/1995 | Sullivan et al. |
| 6,077,412 A | 6/2000 | Ting et al. |

(Continued)

FOREIGN PATENT DOCUMENTS

| EP | 2937313 A1 | 10/2015 |
| WO | 2013048063 A1 | 4/2013 |

(Continued)

OTHER PUBLICATIONS

"Graphenea granted patent on graphene transfer," Graphenea, Retrieved online from <Graphenea granted patent on graphene transfer>, Feb. 9, 2015, 6 pages.

(Continued)

*Primary Examiner* — Binh X Tran
(74) *Attorney, Agent, or Firm* — Fredrikson & Byron, P.A.

(57) ABSTRACT

Aspects of the disclosure include systems and methods for removing a sample from a carrier material and depositing the sample onto a substrate. The sample can be placed in an aperture of a substrate guide on a stage within a cavity. Etching fluid can be introduced into the cavity to etch the carrier material from the sample and then drained. A rinsing material can be introduced into the cavity to rinse the etching fluid and then drained. A sample deposition process can be performed wherein rinsing fluid is introduced into the cavity to raise the sample guide and sample above the level of a substrate on a substrate holder. The substrate holder can be positioned relative to the sample guide so that the sample within the aperture aligns with the substrate on the substrate holder. The rinsing fluid is drained so that the sample is lowered onto the substrate.

28 Claims, 18 Drawing Sheets

(58) Field of Classification Search
USPC .......................................................... 216/92
See application file for complete search history.

(56) References Cited

U.S. PATENT DOCUMENTS

| | | |
|---|---|---|
| 8,916,057 B2 | 12/2014 | Hong et al. |
| 9,394,178 B2 | 7/2016 | Bedell et al. |
| 9,573,814 B2 | 2/2017 | Patil et al. |
| 2006/0110143 A1* | 5/2006 | Ito .................... H01L 21/67051 392/388 |
| 2010/0143726 A1 | 6/2010 | Golzhauser et al. |
| 2014/0001152 A1 | 1/2014 | Zurutuza Elorza et al. |
| 2015/0093905 A1* | 4/2015 | Fujiwara ........... H01L 21/67051 438/745 |
| 2015/0371848 A1 | 12/2015 | Zaretski et al. |
| 2016/0137507 A1 | 5/2016 | You et al. |
| 2018/0182638 A1* | 6/2018 | Kagawa .............. H01L 21/0209 |
| 2018/0233384 A1* | 8/2018 | Nagai ................ H01L 21/67248 |
| 2019/0293625 A1* | 9/2019 | Aoki ................ G01N 27/44791 |

FOREIGN PATENT DOCUMENTS

| | | |
|---|---|---|
| WO | 2015197217 A1 | 12/2015 |
| WO | 2017097279 A1 | 6/2017 |

OTHER PUBLICATIONS

Belyaeva et al., "Molecular Caging of Graphene with Cyclohexane: Transfer and Electrical Transport," ACS Central Science, vol. 2, 2016, pp. 904-909.

Lima et al., "Lateral Non-covalent Clamping of Graphene at the Edges Using a Lipid Scaffold," ACS Applied Materials 3, Interfaces, vol. 10, 2018, pp. 11328-11332.

International Patent Application No. PCT/US2019/033410, International Search Report and Written Opinion dated Aug. 27, 2019, 9 pages.

* cited by examiner

METHOD AND APPARATUS FOR TRANSFER OF TWO-DIMENSIONAL MATERIALS

RELATED MATTERS

This application is a National Stage filing from International Patent Application No. PCT/US2019/033410, filed May 21, 2019, which claims priority to U.S. Provisional Application No. 62/674,715, filed May 22, 2018, the entire contents of which is incorporated herein by reference.

BACKGROUND

Two-dimensional materials such as graphene are often most conveniently, effectively, and/or efficiently created as a sample comprising the material of interest fixed to an initial carrier. However, while the carrier may be best suited for creating the material of interest, it is generally not desired for subsequent use of the material of interest, such as when fabricating a device utilizing the material of interest. Thus, in such cases, removal of the material of interest from the carrier may be required. For example, graphene is often produced on a copper foil, resulting in a material of interest, graphene, on a carrier, the copper foil. However, to effectively utilize the graphene, it must be removed from the copper before it is placed on the substrate on which it is to be used.

Mechanical separation of the material of interest from the carrier is often difficult or impossible to accomplish without causing significant damage to the material of interest. Thus, chemical processes are often used as a way to separate the material of interest from the carrier. In a typical etching process, a person will manually grab the sample (the carrier having the material attached thereto) and place the sample in an etching fluid that is formulated to etch the carrier away from the material of interest.

Depending on the chemistry used and the amount of carrier present in the sample, when reactants in the etching fluid are depleted, the sample can be manually removed from the etching fluid and placed in a fresh batch of the etching fluid if necessary. This process is repeated until the carrier is effectively removed. Then the remaining material of interest is rinsed, for example, using deionized water, to remove the etching fluid.

This practice has many potential problems. Repeated physical handling of the sample (e.g., during one or more etching steps) and/or the material of interest by itself (e.g., during one or more rinsing steps) can damage and material of interest, reducing its quality and/or the amount of useful material gained from the sample. Additionally, while the etching fluid may be formulated to not attack the material of interest as aggressively as it does the carrier, excess exposure of the material to the etching fluid, such as during physical maneuvering of the sample and/or the material itself and/or due to turbulence of the etching fluid causing it to splash onto to material surface during etching, may still damage the material, lowering its quality or rendering it unusable.

SUMMARY

Systems according to some aspects of the disclosure include a process vessel including a main chamber having a cavity therein defined by a sidewall. The system can include a sample stage having a platform portion exposed to the cavity in the main chamber. The system includes a flow channel in fluid communication with the cavity of the main chamber and a fluid interface in fluid communication with the flow channel. Fluid from one or more fluid sources can be introduced into the main chamber via the fluid interface and the flow channel, and fluid can be drained from the main chamber via the fluid interface and the flow channel.

In some embodiments, the process vessel includes a neck portion extending away from the cavity, the sample stage includes a stem portion extending away from the platform portion, and the stem portion of the sample stage is generally positioned within the neck portion of the process vessel. The flow channel can be formed between the stem portion of the sample stage and the neck portion of the process vessel.

Systems can include a sample guide positioned in the cavity of the main chamber. The sample guide can include an aperture therein. In some examples, the sample guide can be placed on the sample stage, and a sample, such as a two-dimensional material on a foil carrier material, can be placed within the aperture of the sample guide.

In some examples, systems can further include a substrate holder having a substrate stage that is movable between a first position and a second position. In some such examples, in the first position, the substrate holder does not block vertical motion of the sample guide within the cavity, and in the second position, the substrate stage of the substrate holder aligns with the aperture in the sample guide.

In some embodiments, the fluid interface of a system includes an inlet/outlet port and a manifold having a first reservoir valve, a second reservoir valve, a fill valve in fluid communication with the inlet/outlet port, and a drain valve. In some such examples, wherein when the first reservoir valve and the fill valve are open, a flow path exists between the first reservoir valve, the manifold, the fill valve, the inlet/outlet port, the flow channel, and the main chamber. Similarly, in some examples, when the second reservoir valve and the fill valve are open, a flow path exists between the second reservoir valve, the manifold, the fill valve, the inlet/outlet port, the flow channel, and the main chamber. In some examples, when the drain valve and the fill valve are open, a flow path exists between the main chamber, the flow channel, the inlet/outlet port, the fill valve, the manifold, and the drain valve. Systems can include a controller configured to control operation of such valves.

In some embodiments, the controller can control operation of the valves in order to selectively introduce fluid from one or more sources into the cavity of the main chamber. In some examples, the controller can control the valves to introduce an etching fluid into the cavity and a rinsing fluid into the cavity, for example, to etch a carrier material away from a sample and to rinse the etching fluid from the system after the etching is complete. The rinsing fluid may also be used to raise the sample guide and a sample to a level that is higher than the substrate holder.

The substrate holder can be moved from the first position to the second position so that a substrate on the substrate stage is positioned below the aperture in the sample guide, wherein a sample is positioned within the aperture after having a carrier material etched away. Draining the rinsing fluid can act to lower the sample guide and sample so that the sample is deposited onto the substrate.

Methods according to some aspects of the disclosure include receiving a carrier carrying a sample onto a platform portion of a sample stage and within an aperture of a sample guide. Methods can include performing a carrier removal process, for example, by introducing an etching fluid into the main chamber from below the stage until the etching fluid reaches an etching level, wherein the etching fluid contacts the underside of the carrier within the aperture of the sample guide. The carrier removal process can further include draining the etching fluid from the main chamber. Such a process can be performed and/or repeated until the carrier is removed from the sample.

Methods can further include performing a rinsing process, for example, by introducing a rinsing fluid into the main chamber from below the stage until the rinsing fluid reaches a rinsing level, wherein the rinsing fluid contacts the underside of the carrier within the aperture of the sample guide and draining the rinsing fluid from the main chamber. In some examples, the rinsing process can be performed and/or repeated until the etching fluid is removed from the cavity.

Methods can further include a sample deposition process. The sample deposition process can include introducing the rinsing fluid into the main chamber from below the stage until the rinsing fluid reaches a deposition level, wherein the rinsing fluid rising to the deposition level raises the sample guide from the stage. The sample deposition process can further include aligning a substrate stage holding a substrate with the sample guide such that the substrate is below the deposition level of the rinsing fluid and is positioned beneath the aperture in the sample guide. The sample deposition process can further include draining the rinsing fluid from the main chamber such that, as the rinsing fluid drains, the sample guide descends relative to the substrate holder such that the sample is deposited onto the substrate that is positioned on the sample stage. In some such example, the substrate and substrate stage travel through the aperture in the sample guide and the sample contacts the substrate.

Fluid can be introduced into the cavity from fluid sources positioned higher than the cavity such that gravity causes the fluid to flow from the fluid sources into the cavity. Gravity-controlled flow can reduce turbulence in the fluid, reducing the likelihood of damaging the sample, for example, by splashing etching fluid onto the sample or causing the sample to fold. System dimensions, such as flow channel dimensions, can encourage laminar flow of the fluid being introduced into the cavity.

DETAILED DESCRIPTION

The following detailed description is exemplary in nature and is not intended to limit the scope, applicability, or configuration of the invention in any way. Rather, the following description provides some practical illustrations for implementing various embodiments of the present invention. Examples of constructions, materials, dimensions, and manufacturing processes are provided for selected elements, and all other elements employ that which is known to those of ordinary skill in the field of the invention. Unless otherwise stated, drawings are not necessarily drawn to scale. Those skilled in the art will recognize that many of the noted examples have a variety of suitable alternatives.

Figure 1A:
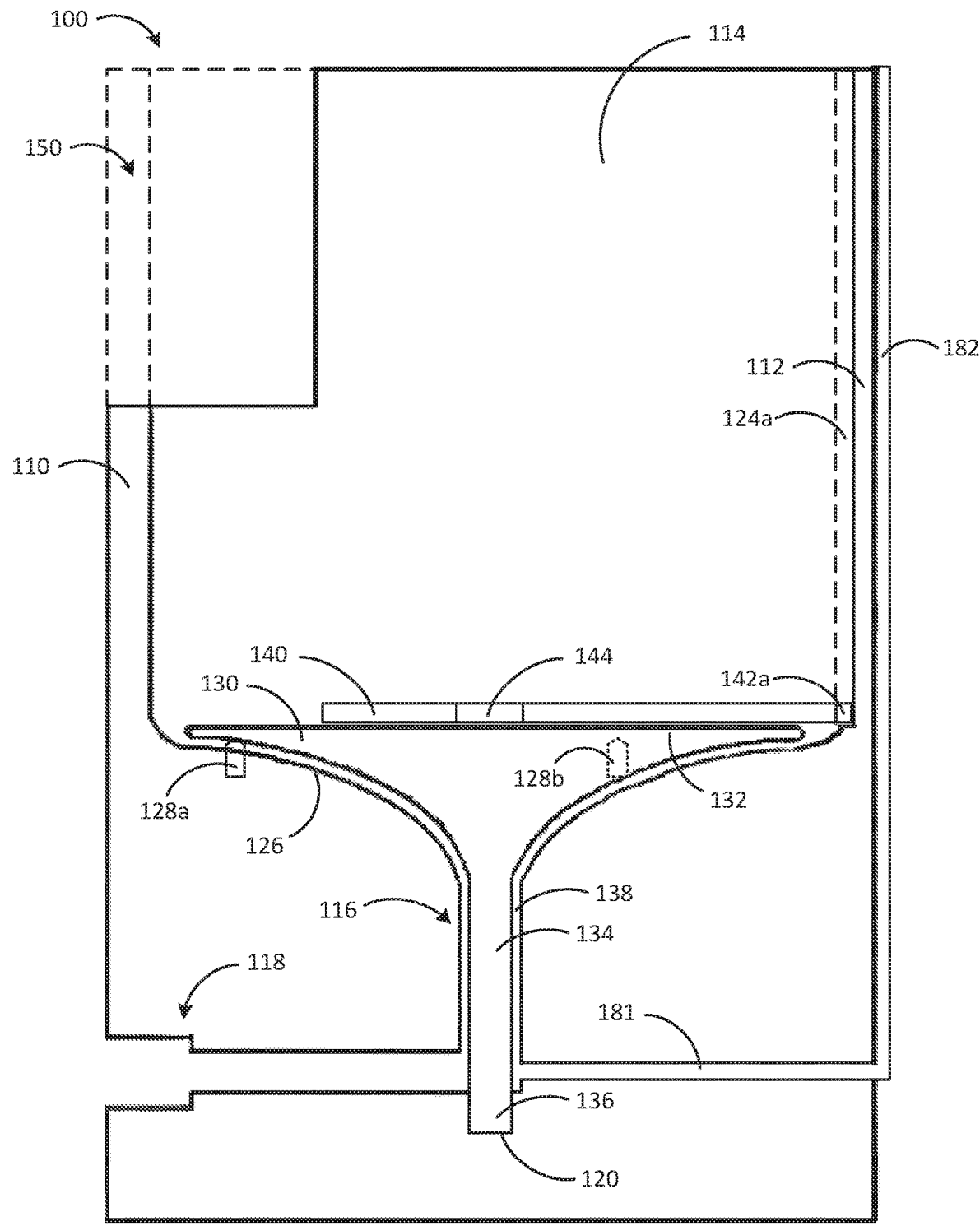
FIG. 1A shows a cross-sectional side view of an exemplary process vessel in a transfer system.

FIG. 1A shows a cross-sectional side view of an exemplary process vessel in a transfer system. Process vessel 100 includes a main chamber 110 having a sidewall 112 defining a cavity 114. In some embodiments, sidewall 112 is generally cylindrical in shape and defines a generally cylindrical cavity 114 therein, though other shapes are possible. The main chamber 110 includes a neck portion 116 that connects the cavity 114 to an inlet/outlet port 118 via which fluid can be introduced to or drained from the cavity 114. While shown as including a single port 118 for both receiving and draining fluid from cavity 114, in some examples, a process vessel can include separate inlet and outlet ports. In some examples, the process vessel comprises a chemically resilient material, such as a high density polyethylene (HDPE), perfluoroalkoxy alkanes (PFA), or polytetrafluoroethylene (PTFE), or others. In some embodiments, the process vessel 100 can be constructed, for example, via machining a solid piece of one of such materials to form the process vessel 100.

In the process vessel 100 includes a sample stage 130 that includes a platform portion 132 and a stem portion 134 that terminates at end 136. As shown, the neck portion 116 of the main chamber includes receiving port 120 that is configured to receive the terminal end 136 of the sample stage 130. In some examples, the terminal end 136 of the sample stage 130 engages the receiving port 120 of the main chamber 110 so as to lock the sample stage 130 in place in the main chamber 110. In various embodiments, terminal end 136 can be attached to the receiving port 120 by any of a variety of attachment techniques, such as via one or more of a threaded coupling, a friction fit, a magnetic coupling, or the like. In other embodiments, terminal end 136 of the sample stage 130 is integrally formed with the receiving port 120 of the main chamber 110.

In some embodiments, when the terminal end 136 of the sample stage 130 is locked in place with the receiving port 120 of the main chamber, the neck portion 116 of the main chamber and the stem portion 134 of the sample stage forms a flow channel 138 creating a flow path between the inlet/outlet port 118 and the cavity 114. In some embodiments, flow channel 138 comprises an annular channel generally surrounding the stem portion 134 of the sample stage 130. In some such embodiments, fluid entering the cavity 114 via the inlet/outlet port 118 and the flow channel 138 generally enters the cavity 114 from all sides around the sample stage 130.

In some embodiments, the system includes a valve, such as an annular valve, positioned in the flow channel 138 to prevent flow of fluid from the flow channel 138 into the cavity 114 of the main chamber 110. In some such examples, the valve can surround the stem portion 134 of the sample stage 130 or can be placed near the periphery of the sample stage 130. Various locations are possible. In some embodiments, flow channel 138 can be defined by the neck portion 116 of the main chamber 110 and the stem portion 134 of the sample stage and generally extend between a bottom surface 126 of the main chamber 110 and a bottom surface of platform 132. In some examples, such a flow channel 138 can encourage laminar flow of fluid between the inlet/outlet port 118 and the cavity 114. In some embodiments including separate inlet and outlet ports, flow channel 138 can be in fluid communication with both the inlet port and the outlet port. In some examples, separate flow channels (e.g., an inlet flow channel and an outlet flow channel) can be used to provide fluid communication between the cavity and separate inlet and outlet ports. For instance, in an example embodiment, an inlet flow channel can provide fluid communication between the cavity an inlet port while an outlet flow channel can provide fluid communication between the cavity an outlet port.

In the illustrated embodiment, the main chamber 110 includes posts 128a, 128b protruding from a bottom surface 126 in the main chamber 110. In some examples, posts 128a, 128b can limit the insertion of the sample stage 130 into the neck portion 116 of the main chamber 110, for example, while securing the terminal end 136 into the receiving port 120 of the main chamber 110. Posts 128a, 128b can retain the sample stage 130 sufficiently far from the bottom surface 126 of the main chamber 110 so that flow channel 138 is not blocked by the sample stage 130. Additionally or alternatively, posts (e.g., 128a, 128b) can be arranged to ensure that the sample stage 130 is level. In various embodiments, any number of such posts can be included in the bottom surface 126 of the main chamber 110. In some examples, the posts can be even distributed about the bottom surface 126 of the main chamber 110. For instance, in an exemplary embodiment, a cylindrical main body of a process vessel includes three posts disposed in a bottom surface thereof approximately equidistant from the central axis of the cylindrical main body and separated from one another by an angle of approximately 120°.

The process vessel 100 further includes a sample guide 140 that is generally vertically movable within the main chamber 110. In the illustrated embodiment, the sample guide 140 is shown as resting on the sample stage 130. In some embodiments, the sample guide 140 is made from a material that will float when fluids, such as deionized water, are present in the cavity 114 of the main chamber 110. For example, in some embodiments, sample guide 140 comprises a HDPE or other chemically resilient material. Thus, during an exemplary operation, fluid may enter the cavity 114 in the main chamber 110 via inlet/outlet port 118 and flow channel 138. The fluid may rise above the level of the top surface of the platform portion 132 of the sample stage 130 and cause the sample guide 140 to float on the surface of the fluid and rise above the sample stage 130 as the fluid level rises.

In the illustrated example, the sample guide 140 includes a tab 142a extending from at least one location along the periphery of the sample guide 140. The tab 142a extends into a guide channel 124a in the sidewall 112 of the main chamber 110. One or more such tabs can engage one or more corresponding vertical channels to generally maintain the sample guide 140 in a fixed horizontal position within the cavity 114 as it rises and falls with the fluid level present in the cavity. In some examples, one or more posts (e.g., 124a, 124b) ensure the sample stage 130 is level, and therefore the sample guide 140 positioned on the sample stage 130 is also level. A level sample stage 130 can ensure that fluid from the flow channel 138 is introduce uniformly around the periphery of the sample guide 140, and a level sample guide 140 can help ensure that sample guide 140 floats vertically, for example, with tab 142a extending into guide channel 124a, without binding against any part of sidewall 112 to restrict vertical motion.

Sample guide 140 includes an aperture 144 extending therethrough. As shown in FIG. 1A, the aperture 144 is positioned approximately above the center of the sample stage 130. During operation, a user may place a sample within the aperture 144 of the sample guide in order to maintain the sample within a predefined area. The sample can include a material of interest on a carrier, for instance, such as graphene on a copper foil. Aperture 144 can be any number of sizes and/or shapes. In some examples, the aperture 144 in the sample guide 140 can be approximately the same shape as the sample to be used and slightly larger in size. Exemplary apertures can be rectangular, circular, or other shapes.

As shown in the illustrated embodiment of FIG. 1A, the main chamber 110 includes a cutaway section 150 shown by broken lines. Cutaway section 150 can be positioned so that fluid in the cavity 114 spills over the sidewall 112 in the cutaway section 150 to be directed to additional locations without spilling over other portions of the sidewall 112.

Figure 1B:
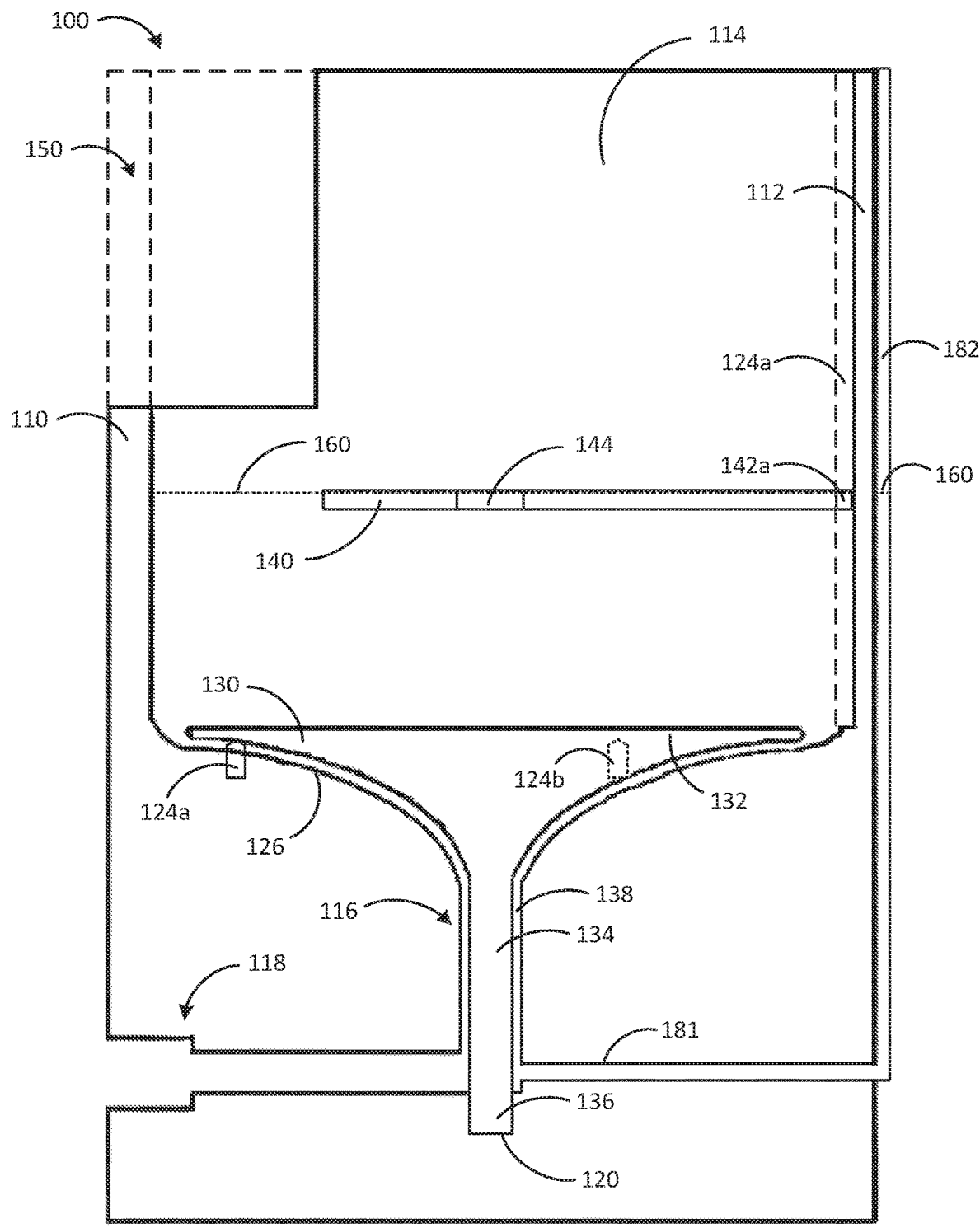
FIG. 1B shows the process vessel of FIG. 1A containing a fluid in the cavity of the main chamber.

FIG. 1B shows the process vessel of FIG. 1A containing a fluid in the cavity of the main chamber. In the example of FIG. 1B, fluid is present in the cavity 114 up to fluid level 160. As shown, sample guide 140 is floating at approximately the fluid level 160. In some examples, the sample guide 140 floats so that a majority of the sample guide 140 is submerged while the top surface remains above the fluid level 160. A sample placed in the cavity within the aperture 144 of the sample guide 140 may float at the fluid level 160 within the aperture 144.

In some examples, the process vessel 100 includes a fluid level measurement chamber 182 in fluid communication with the flow channel 138 such that as the fluid level rises in the cavity 114, fluid rises similarly in the fluid level measurement chamber 182. Thus, fluid level 160 is present in both the cavity 114 and the fluid level measurement chamber 182. In the illustrated example, fluid level measurement chamber 182 is in fluid communication with the flow channel 138 via a fluid measurement channel 181. Measurement of the fluid level in the fluid level measurement chamber 182 can be performed manually, for example, via a transparent sidewall of the chamber, and or automatically, for example, via one or more capacitive sensors, optical sensors, ultrasonic sensors, mechanical sensors, or the like. In the illustrated example of FIG. 1A, fluid level measurement chamber 182 is positioned outside of sidewall 112. In other embodiments, a similar fluid level measurement chamber 182 can be positioned within the sidewall 112 and operate in a similar way. In some examples, a fluid level measurement chamber 182 can be omitted, and a fluid level sensor can be configured to measure the level of fluid within the cavity 114 itself.

In some examples, the aperture 144 prevents the sample from significant lateral movement across the surface of the fluid so that the location of the sample remains known and controlled. Additionally, in some such examples, the tab 142a positioned in guide channel 124a, for example, in addition to other similar features not shown in FIG. 1A or 1B, prevent the sample guide 140, and therefore the sample within the aperture 144, from significant lateral movement across the fluid surface.

It will be appreciated that other configurations and/or components can be used to generally prevent undesired lateral motion of the sample guide and/or the sample within the aperture of the sample guide. For instance, in some embodiments, one or more vertically extending tabs can be formed along an inner surface of the sidewall and can be configured to engage corresponding notches formed in the sample guide. In other examples, tabs and channels can be excluded, and the sample guide may be sized so as to generally prevent lateral motion within the cavity, for example, having an outer perimeter that contacts or nearly contacts an inner surface of the sidewall about a majority of the sample guide, preventing or restricting lateral motion of the sample guide. A variety of additional or alternative components can be used, such as one or more magnets or the like. In some embodiments, different configurations for preventing or limiting lateral motion of the sample stage can be implemented according to a desired material of interest and/or carrier to be used.

In general, components of the process vessel described herein can be made from the same or different materials. Such materials are generally chemically resilient materials such as described herein. In various examples, such components can be machined from bulk material, injection molded, 3D printed, or assembled via one or more other methods.

Figure 2:
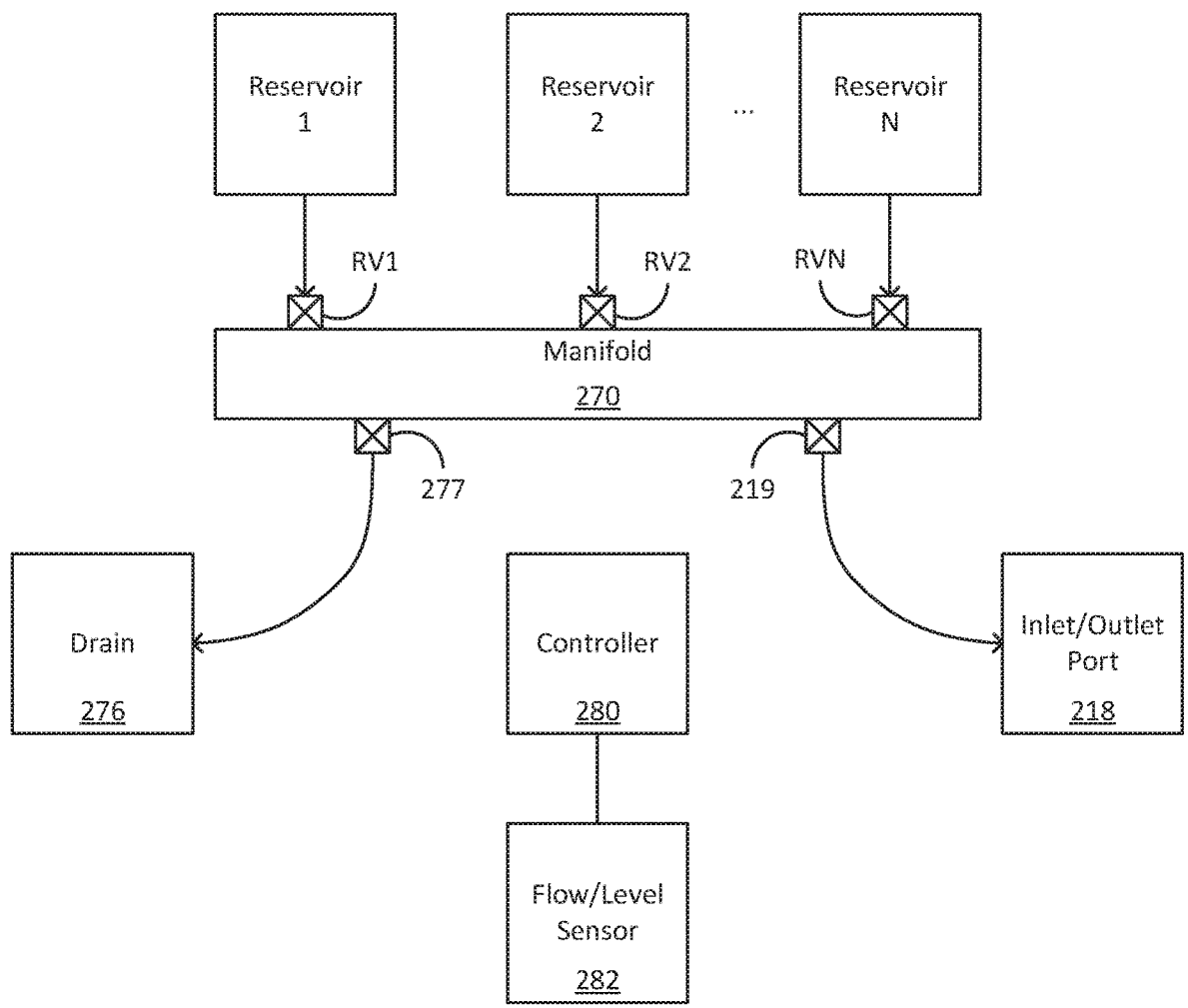
FIG. 2 shows a schematic diagram of a plurality of fluid sources in communication with the inlet/outlet port of a process vessel.

The fluid in the cavity 114 shown in FIG. 1B can be any of a plurality of fluids. FIG. 2 shows a schematic diagram of a plurality of fluid sources in communication with the inlet/outlet port of a process vessel. In the example of FIG. 2, a plurality of reservoirs, Reservoir 1, Reservoir 2, . . . , Reservoir N are in fluid communication with a manifold 270. Fluid flow between each of reservoirs and the manifold 270 is controlled by a respective valve, RV1, RV2, . . . , RVN. Each reservoir can include a fluid for use with the process vessel.

In an exemplary embodiment, a first reservoir RV1 holds an etching fluid and a second reservoir RV2 holds deionized water. Additional reservoirs can include other fluids, such as one or more cleaning agents, electrolyte materials, or the like. Additionally or alternatively, additional reservoirs can include backup reservoirs, for example, of deionized water or etching fluid. In some examples, each of a plurality of reservoirs stores a corresponding one of a plurality of different etching fluids that are generally used to etch different materials for different processes. Similarly, in some examples, a single reservoir can be swapped out with a different reservoir to provide a fluid having desired properties for a process to be performed. In various examples, reservoirs can be holding tanks, bottles, or other fluid storage containers.

The manifold is in communication with the inlet/outlet port 218 of a process vessel, such as inlet/outlet port 118 in FIGS. 1A and 1B, via a fill valve 219. In some embodiments, the fill valve 219 includes a proportional valve capable of providing an adjustable flow rate of fluid therethrough. For example, in some such embodiments, a proportional fill valve can open an aperture to a variable size to allow fluid to flow therethrough at a rate corresponding to the aperture size. In some alternate embodiments, fill valve can include other types of valves, including, for example, isolation valves.

In some examples, to provide fluid from first reservoir RV1 to the cavity of process vessel via the inlet/outlet port 218, first reservoir valve RV1 and fill valve 219 can be opened to provide fluid communication between the first reservoir RV1 and the inlet/outlet port 218 via the manifold. In some embodiments, fill valve 219 can be configured to open very slowly so as to introduce fluid into the inlet/outlet port 218 gently and with minimal turbulence. For instance, in some embodiments, fill valve 219 comprises a proportional valve that is opened slowly in response to a received signal or actuation. The slowly-opened proportional valve can reduce turbulence of fluid introduced via valve 219 into the inlet/outlet port 218.

In some examples, the reservoirs RV1, RV2, . . . , RVN are positioned higher than the process vessel so that gravity provides enough force to cause sufficient fluid to flow from any of the reservoirs to the cavity (e.g., to fill the cavity to a sufficient operating level). In some such embodiments, inlet/outlet port 218 can be located below, above, or at the same level as manifold 270, as long as the source reservoir is positioned higher than the highest desired fluid level in the process vessel. Utilizing gravity to transfer fluid can reduce turbulence induced by the starting and/or operating of one or more pumps, and generally provides a constant or approximately constant flow rate and fluid force in the system. In other examples, one or more pumps can be utilized to transfer fluid from a reservoir into the inlet/outlet port 218. Additionally or alternatively, one or more pumps could be utilized to refill reservoirs RV1 . . . RVN from other fluid sources.

The diagram of FIG. 2 further includes a drain 276 coupled to the manifold 270 via drain valve 277. In some embodiments, when the process vessel is to be drained, all reservoir valves RV1, RV2, . . . , RVN are closed, and the drain valve 277 and the fill valve 219 are opened so that fluid flows from the process vessel through the inlet/outlet port 218, the fill valve 219, the manifold 270, and the drain valve 277 to the drain 276. In some embodiments, the drain 276 is positioned lower than the inlet/outlet port 218 of the process vessel so that the fluid in the process vessel drains due to gravity. In other examples, one or more pumps can be used to facilitate draining.

The diagram of FIG. 2 further includes a controller 280. The controller can be configured to control operation of the reservoir valves RV1, RV2, . . . , RVN as well as the drain valve 277 and the fill valve 219. In various embodiments, control of the valves can be performed in any of a variety of ways. For instance, controller 280 can be configured to apply electrical power to one or more such valves to control operation thereof (e.g., via solenoid control). Additionally or alternatively, one or more valves can be actuated pneumatically. In some examples, the controller 280 can provide control signals via wired or wireless communication to one or more valves to trigger actuation of the valves. In general, any of a variety of types of valves can be used. In some examples, fill valve 219 is configured as a high-precision valve and/or a valve having a very slow turn-on flow rate.

In some embodiments, controller can be in communication with other components, such as a flow meter and/or a fluid level sensor (e.g., a capacitive sensor, an optical sensor, a proximity sensor, such as an infrared proximity sensor, a mechanical sensor, ultrasonic sensor, or the like) 282 such that the controller can measure and/or calculate (e.g., via a flow rate and time) an amount of fluid present in the process vessel. For instance, in some embodiments, the controller 280 can be programmed to perform a series of filling and draining processes by controlling a plurality of valves and/or pumps. The controller 280 can determine an amount of fluid in the process vessel at a given time via communication with sensor 282 and use the determined amount as a feedback signal to determine when to start and stop various drain or fill processes. As described with respect to FIG. 1A, in various examples, a fluid level sensor can be configured to directly measure the fluid within a cavity of the process vessel or can be configured to measure fluid within a fluid level measurement chamber separate from but in fluid communication with the cavity.

Figure 3A:
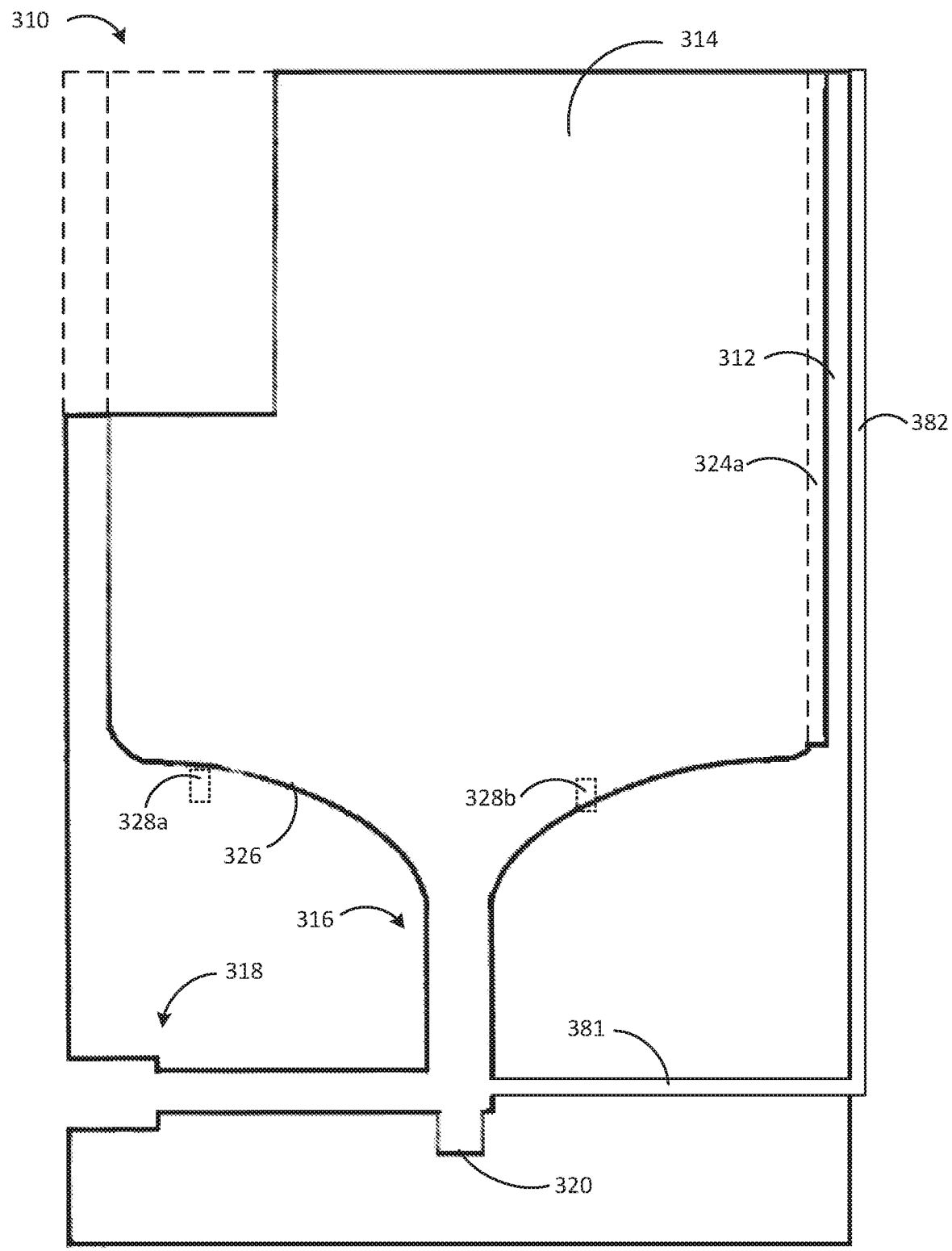
FIG. 3A shows a front-on cross-sectional view of the main chamber according to an exemplary embodiment.

FIG. 3A shows a front-on cross-sectional view of the main chamber according to an exemplary embodiment. In the example of FIG. 3A, main chamber 310 includes a sidewall 312 defining a cavity 314. In some examples, cavity 314 is approximately cylindrical in shape. The main chamber 310 includes a bottom surface 326 having including posts 328a, 328b attached thereto. In some examples, posts 328a, 328b are inserted into bore holes formed in the bottom surface 326. In the example of FIG. 3A, the sidewall 312 includes a guide channel 324a extending vertically within the cavity 314.

The main chamber 310 includes a neck portion 316 extending downward from the bottom surface 326 and terminating in a receiving port 320. Receiving port can include one or more attachment mechanisms for receiving and securing additional components (e.g., sample stage 130 in FIG. 1A), such as threads (e.g., female threads), a magnetic coupling, or the like. Neck portion 316 provides fluid communication between the cavity 314 in the main chamber 310 and an inlet/outlet port 318. In the illustrated example, the bottom surface 326 of the main chamber 310 is curved toward the neck portion 316, though other shapes are possible.

The main chamber 310 of FIG. 3A includes a fluid level measurement chamber 382 in fluid communication with the cavity 314 via fluid measurement channel 381. While shown as being position outside of the sidewall 312 in the embodiment of FIG. 3A, in some examples, fluid level measurement chamber 382 can be positioned within the sidewall 312 or omitted entirely.

Figure 3B:
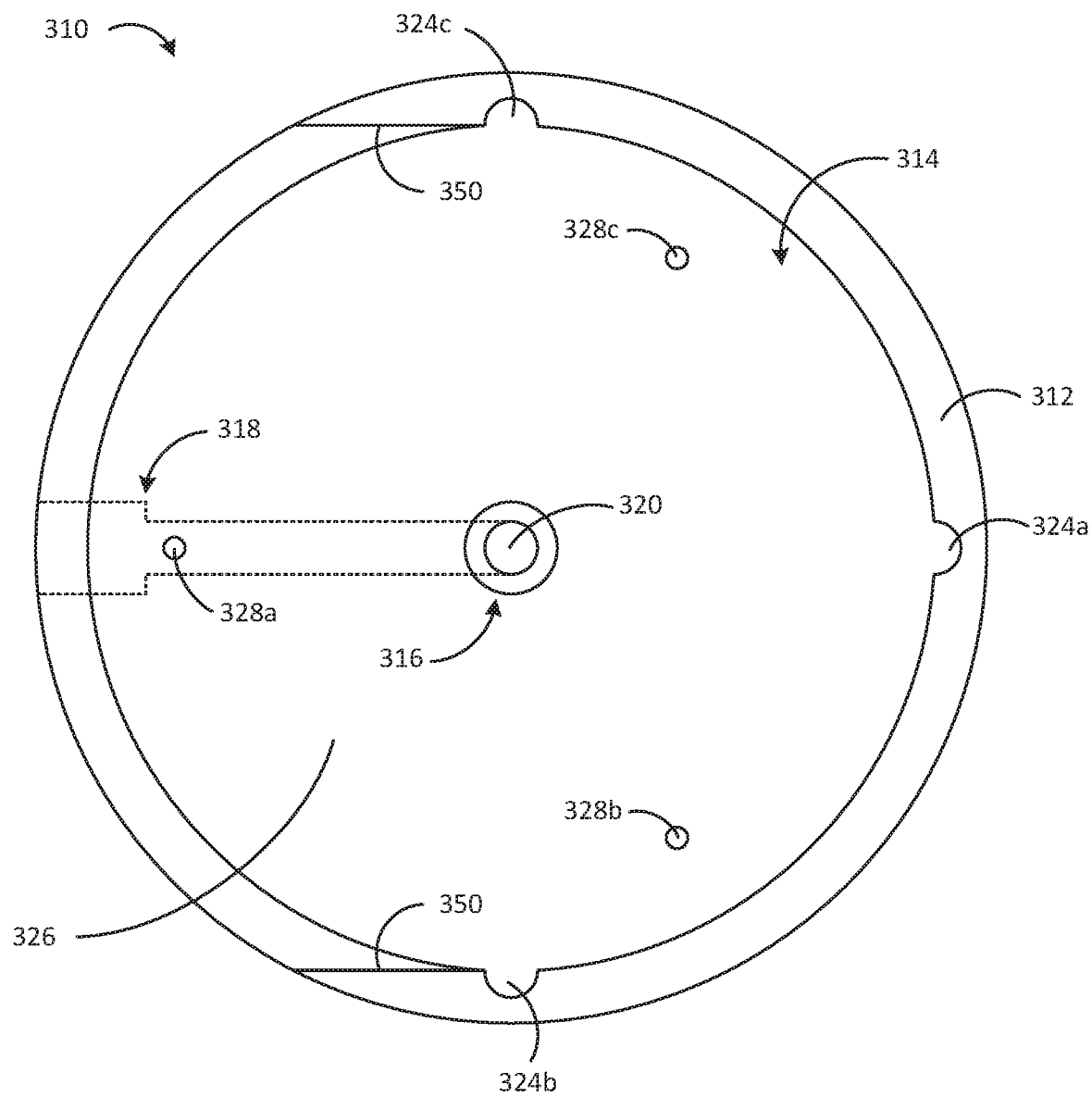
FIG. 3B shows a top-down view of the main chamber shown in FIG. 3A.

FIG. 3B shows a top-down view of the main chamber shown in FIG. 3A. As shown, main chamber 310 includes a sidewall 312 defining a cavity 314. The top-down view of FIG. 3B shows three guide channels 324a, 324b, 324c formed in the sidewall 312. In the illustrated example, guide channels are semi-circular in shape, though various shapes are possible. In some embodiments, the guide channels 324a, 324b, 324c are shaped to receive a corresponding portion of a sample guide (e.g., 140 in FIG. 1A). Similarly, while three guide channels 324a, 324b, 324c are shown in the illustrated example, any number of guide channels may be used. In embodiments including a plurality of guide channels, guide channels can extend vertically in the housing sidewall 312 and can be spaced radially about the sidewall 312 in any configuration. In the illustrated embodiment, guide channels 324a, 324b, 324c are radially separated by approximately 90° angles within the sidewall 312.

The main chamber 310 includes a bottom surface 326 that meets a neck portion 316. In the illustrated example, neck portion 316 is approximately centered in the bottom surface 326. As described with respect to FIG. 3A, neck portion 316 terminates in a receiving port 320, and provides fluid communication between an inlet/outlet port 318 and the cavity 314 in the main chamber 310.

Figure 3C:
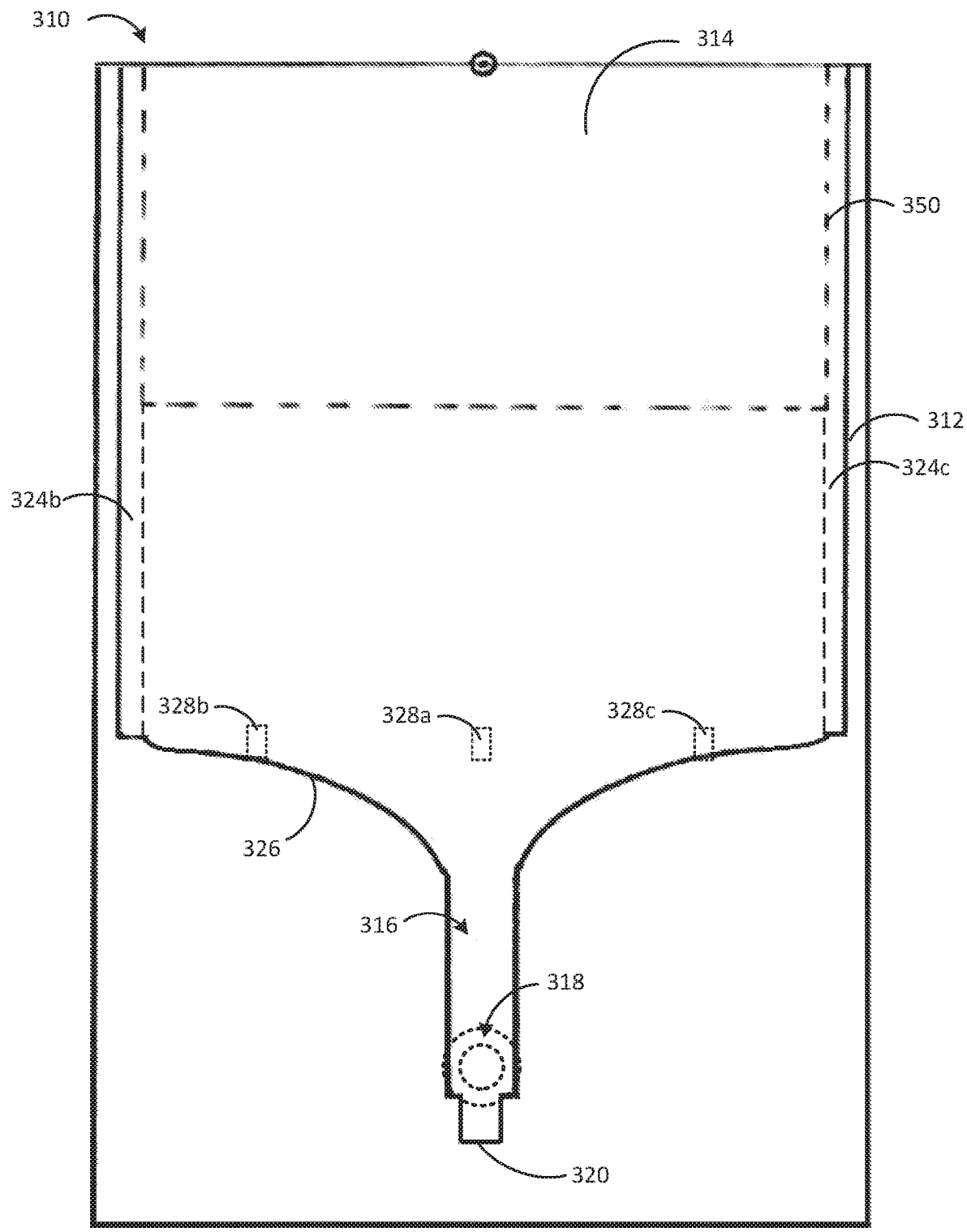
FIG. 3C shows a cross-sectional side view of the main chamber of FIGS. 3A and 3B.

The main chamber 310 shown in FIG. 3C includes posts 328a, 328b, 328c placed in a bottom surface 326. In the illustrated example, the main chamber 310 includes three posts 328a, 328b, 328c radially separated from one another by approximately 120°. However, it will be appreciated that any number and spacing of such posts may be used.

The sidewall 312 in the main chamber 310 includes a cutaway section 350 similar to cutaway section 150 of FIG. 1.

FIG. 3C shows a cross-sectional side view of the main chamber of FIGS. 3A and 3B. In this cross-section, both guide channels 324b and 324c of sidewall 312 can be seen. While not necessarily in the plane of the cross-section, the relative horizontal positioning of posts 328a, 328b, 328c are shown along bottom surface 326 of the cavity 314. Neck portion 316 terminates in receiving port 320 and provides fluid communication between the cavity 314 and the inlet/outlet port 318.

Figure 4A:
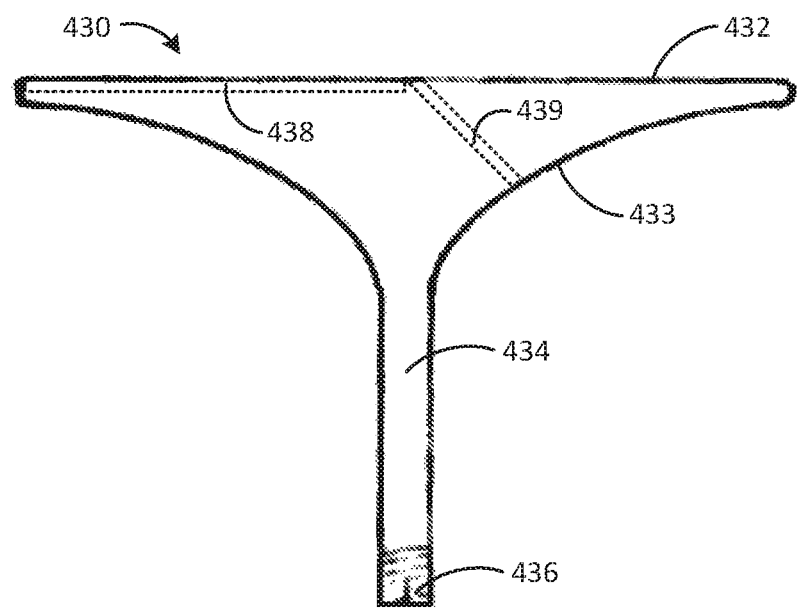
FIG. 4A shows a side view of an exemplary sample stage.

FIG. 4A shows a side view of an exemplary sample stage. In the embodiment of FIG. 4A, sample stage 430 includes a platform portion 432 and a stem portion 434 extending downward from platform portion 432. Stem portion 434 terminates in a terminal end 436 that can be configured to be secured to a receiving port (e.g., 320) in the main chamber. For instance, in various embodiments, the terminal end 436 includes a corresponding attachment mechanism to an attachment mechanism associated with the receiving port. In some examples, terminal end 436 is threaded to mate with corresponding threads in the receiving port. Additionally or alternatively, terminal end 436 and the receiving port can be attached in other ways, such as by being magnetically attracted to one another, wherein one or both components include a magnetic material, forming a press-fit relationship, being formed integrally with one another (e.g., a single integral piece of HDPE material), or the like.

In the illustrated example, sample stage 430 includes a curved bottom surface 433 extending between the stem portion 434 and the platform portion 432. In some examples, the curved bottom surface 433 follows approximately the same contour as a corresponding curved bottom surface (e.g., 326) of the main chamber. In some embodiments, curved bottom surface 433 contacts one or more posts (e.g., 328a, 328b, 328c) positioned in a bottom surface (e.g., 326) of the main chamber when the terminal end 436 engages a corresponding receiving port (e.g., 320) of the main chamber.

In some embodiments, the periphery of the sample stage 430 has a rounded profile transitioning between the curved bottom surface 433 and the platform portion 432, such as shown in FIG. 4A. In some examples, the curved surface reduces surface tension of fluid as the fluid flows from the fluid channel (e.g., 138) to the platform portion 432 of the sample stage. This can reduce turbulence in flow of the fluid as it flows over the edge of the sample stage 430 toward a sample.

Figure 4B:
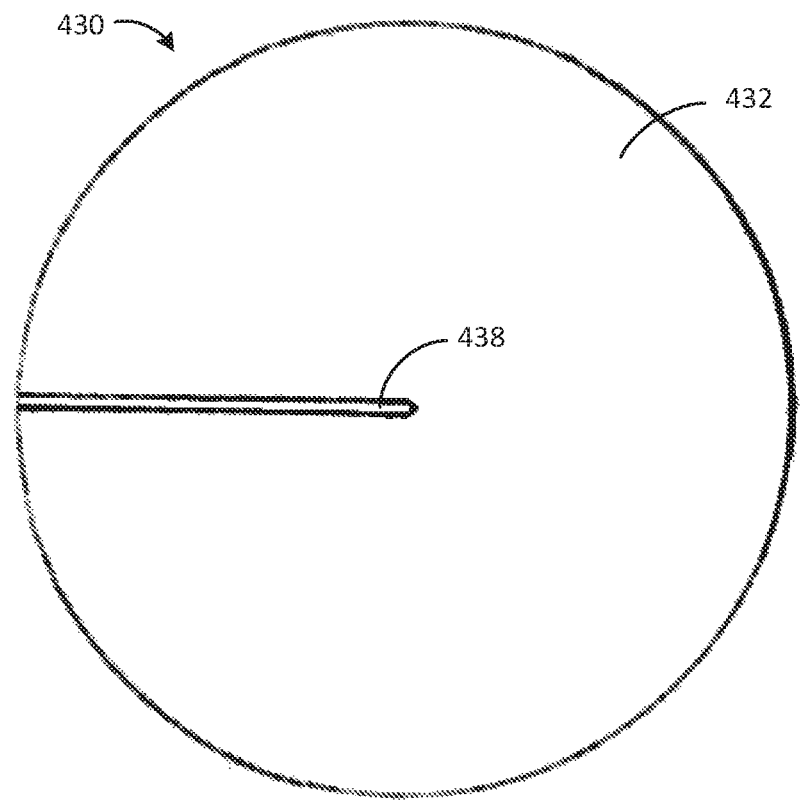
FIG. 4B is a top-down view of the sample stage shown in FIG. 4A.

FIG. 4B is a top-down view of the sample stage shown in FIG. 4A. FIG. 4B shows the platform portion 432 of sample stage 430. As shown, the top surface of the platform portion 432 includes a channel 438 extending partially across the surface. In some examples, channel 438 comprises a square or rounded cross-section extending below the surface of the platform portion 432. Broken lines in FIG. 4A show channel 438 extending below the surface of the platform portion 432 across approximately half of the sample stage. In such examples, when a fluid rises from the bottom of the sample stage 430 toward the platform portion 432, the fluid will fill the channel 438 and transport the fluid toward the center of the stage 430 before contacting and lifting the sample guide (e.g., 140) from the platform portion 432.

While shown as including a single channel 438 that extends from a periphery of the stage to the center of the stage, in some examples, the stage 430 can include one or more such channels arranged in a variety of configurations. For example, in some embodiments, channel 438 extends across the entire diameter of the stage 430. Additionally or alternatively, a second channel can intersect channel 438, for example, in the center of the stage 430. In various embodiments, one or more channels can extend from the periphery of the stage 430 toward the center of the stage. In some examples, one or more channels can extend across the diameter of the stage 430, and embodiments including a plurality of channels can include such channels intersecting in the center of the stage 430. In an example embodiment, a stage includes two intersecting channels formed in the platform portion of the stage, the intersecting channels extending across the entire diameter of the stage and intersecting at the center of the stage. In some such examples, such channels can be oriented substantially perpendicular to one another.

Additionally or alternatively to the channel 438, the stage 430 can include a channel 439 extending from the center or near the center of the platform portion 432 of the sample stage to the curved bottom surface 433 and/or the stem portion 434 of the sample stage 430. Such a channel can fill with fluid from the flow channel (e.g., 138 in FIG. 1) as the fluid level rises, and introduce fluid from the flow channel to the bottom of a sample atop the stage 430.

Figure 5A:
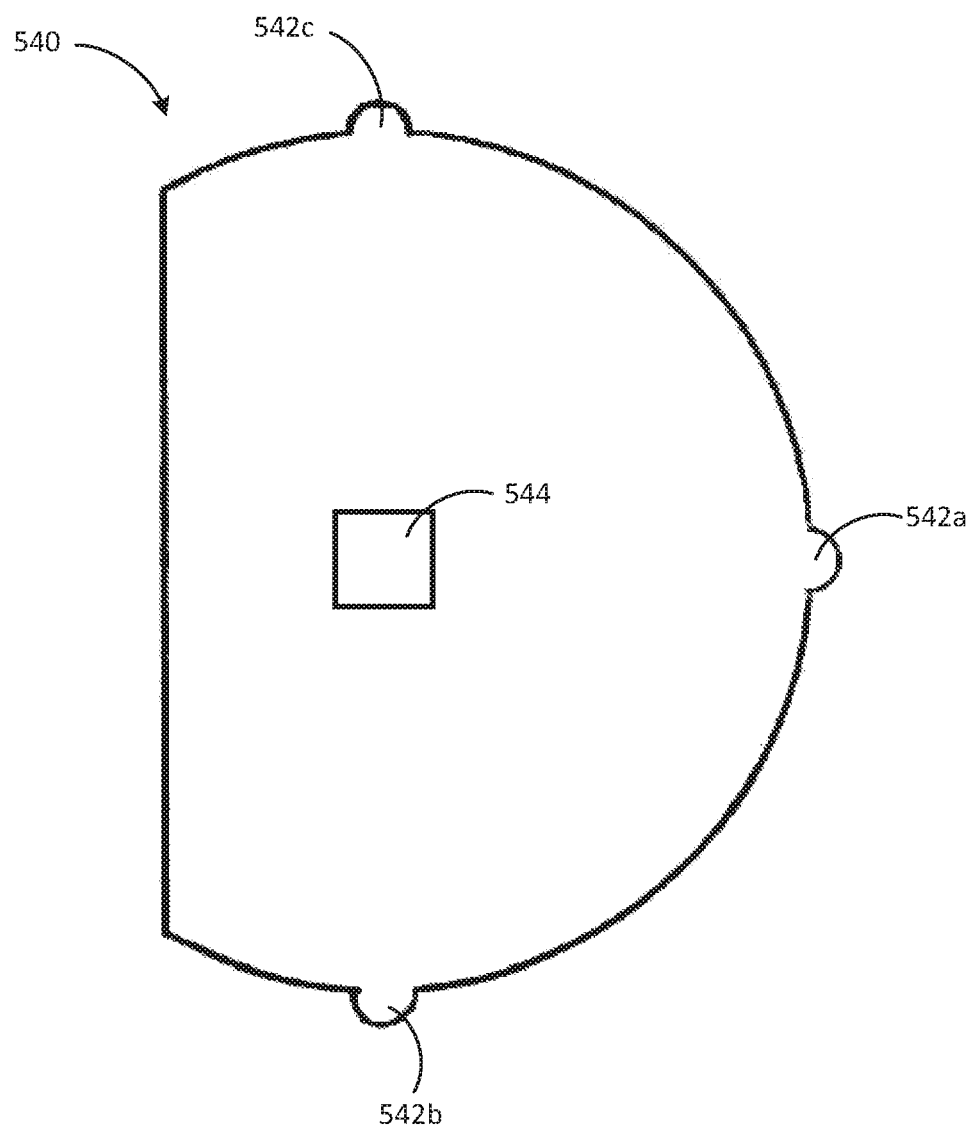
FIG. 5A shows a top-down view of an exemplary sample guide.

FIG. 5A shows a top-down view of an exemplary sample guide. The sample guide 540 of FIG. 5A includes a plurality of tabs 542a, 542b, 542c disposed along the periphery of the sample guide 540. In some examples, tabs 542a, 542b, 542c are sized and positioned to engage a corresponding plurality of guide channels (e.g., 324a, 324b, 324c in FIG. 3B) when the sample guide 540 is positioned within the cavity of a main chamber. As described elsewhere herein, sample guide can be made from a material that floats in fluid introduced in the cavity. Guide channels in the cavity sidewall can interface with tabs 542a, 542b, 542c so that, when floating within the cavity, the sample guide 540 is generally limited to approximately vertical motion within the cavity.

The sample guide 540 includes an aperture 544 extending therethrough. As described elsewhere herein, in various embodiments, aperture 544 can be any of a variety of shapes and sizes. In some examples, aperture 544 is sized and shaped to approximately match the size and shape of a sample for processing via the process vessel. During operation, for example, when filling the process vessel with fluid, the aperture 544 of the sample guide 540 can hold the sample in an approximately fixed horizontal location as the sample and the sample guide 540 rise with the fluid level.

Figure 5B:
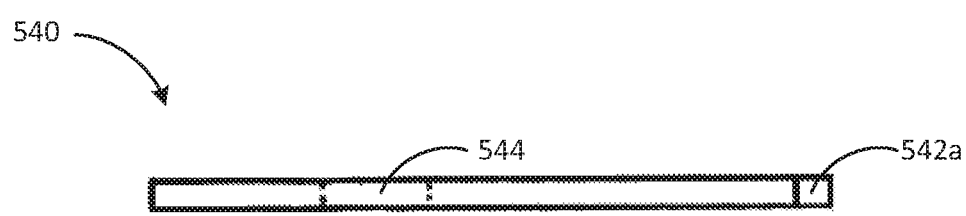
FIG. 5B shows a front elevation view of the sample guide of FIG. 5A.

FIG. 5B shows a front elevation view of the sample guide of FIG. 5A. As shown, sample guide 540 includes aperture 544 extending therethrough and tab 542 extending outward at the edge of the sample guide 540.

With respect to FIGS. 4B and 5A, in some examples, when the sample guide 540 is positioned on the sample stage 430, channel 438 extends into the area defined by the aperture 544 in the sample guide 540. Thus, when fluid fills the cavity (e.g., 114) of the process vessel, fluid that enters the channel 438 will contact a sample in the aperture 544 from below (e.g., on a carrier surface) lifting the sample in the aperture, and preventing flow onto the top of the sample.

Figure 6A:
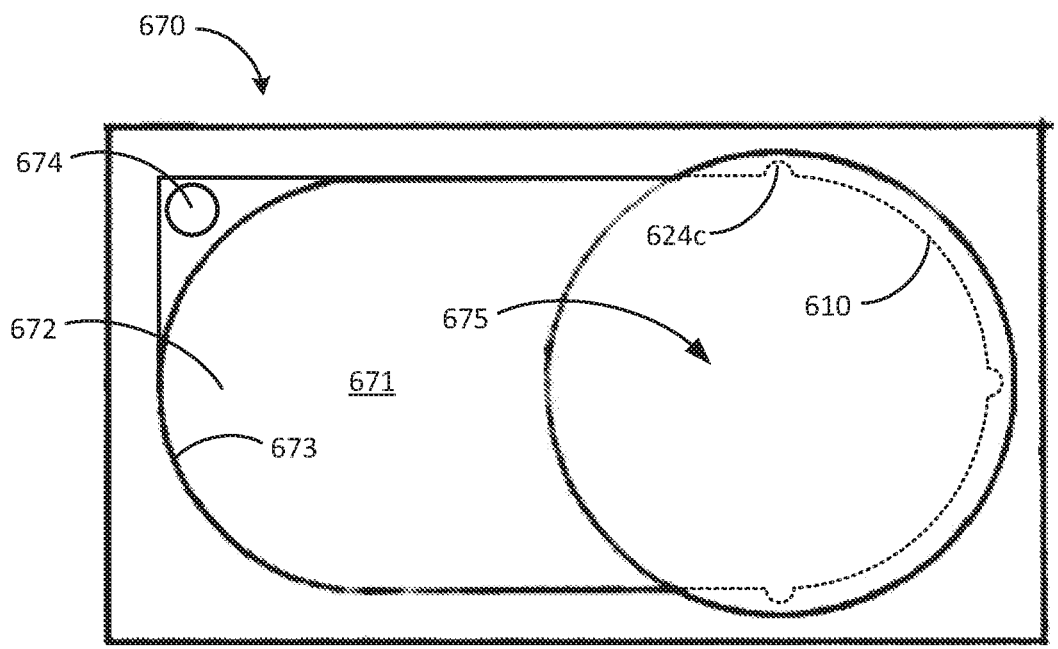
FIG. 6A shows a top-down view of a substrate tub that can be attached to the process vessel such as those described herein.

FIG. 6A shows a top-down view of a substrate tub that can be attached to the process vessel such as those described herein. As shown, substrate tub 670 includes a cutout portion 675 that can be positioned over the cavity of the process vessel. Broken line 610 shows an approximate outline of a main chamber positioned beneath the cutout portion 675 of the substrate tub 670. Substrate tub 670 further includes a basin 672 defined by a sidewall 673 and having a floor 671. In some embodiments, basin 672 abuts the process vessel (e.g., 110) proximate a cutaway section (e.g., 150) so that fluid that flows over the sidewall of the cutaway section fills the basin 672. The substrate tub 670 further includes an overflow drain 674 above the floor 671 of the basin 672 so to prevent fluid from overflowing from the basin 672 out of the system.

Figure 6B:
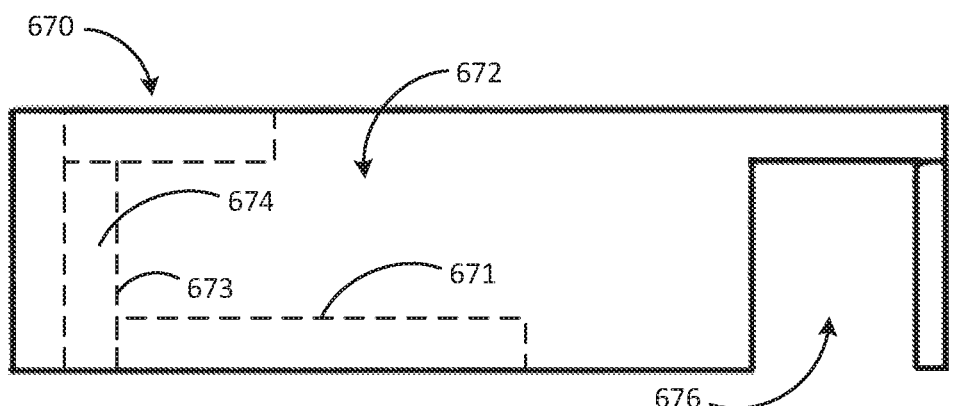
FIG. 6B shows a front elevation view of the substrate tub of FIG. 6A.

FIG. 6B shows a front elevation view of the substrate tub of FIG. 6A. As shown, substrate tub 670 includes basin 672 having a sidewall 673, a floor 671, and an overflow drain 674. The substrate tub 670 includes a first cutaway section 676 proximate a corner of the front face of the substrate tub 670.

Figure 6C:
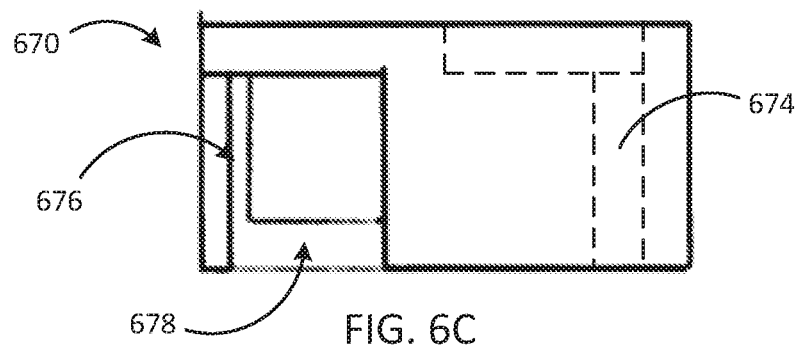
FIG. 6C shows a right side elevation of the substrate tub of FIGS. 6A and 6B.

FIG. 6C shows a right side elevation of the substrate tub of FIGS. 6A and 6B. FIG. 6C shows a second cutaway section 678 on the right face of the substrate tub 670 proximate the first cutaway section 676 in the front face. In some examples, cutaway sections 676, 678 provide access to a sidewall of the main chamber when the substrate tub 670 is attached thereto.

Figure 7:
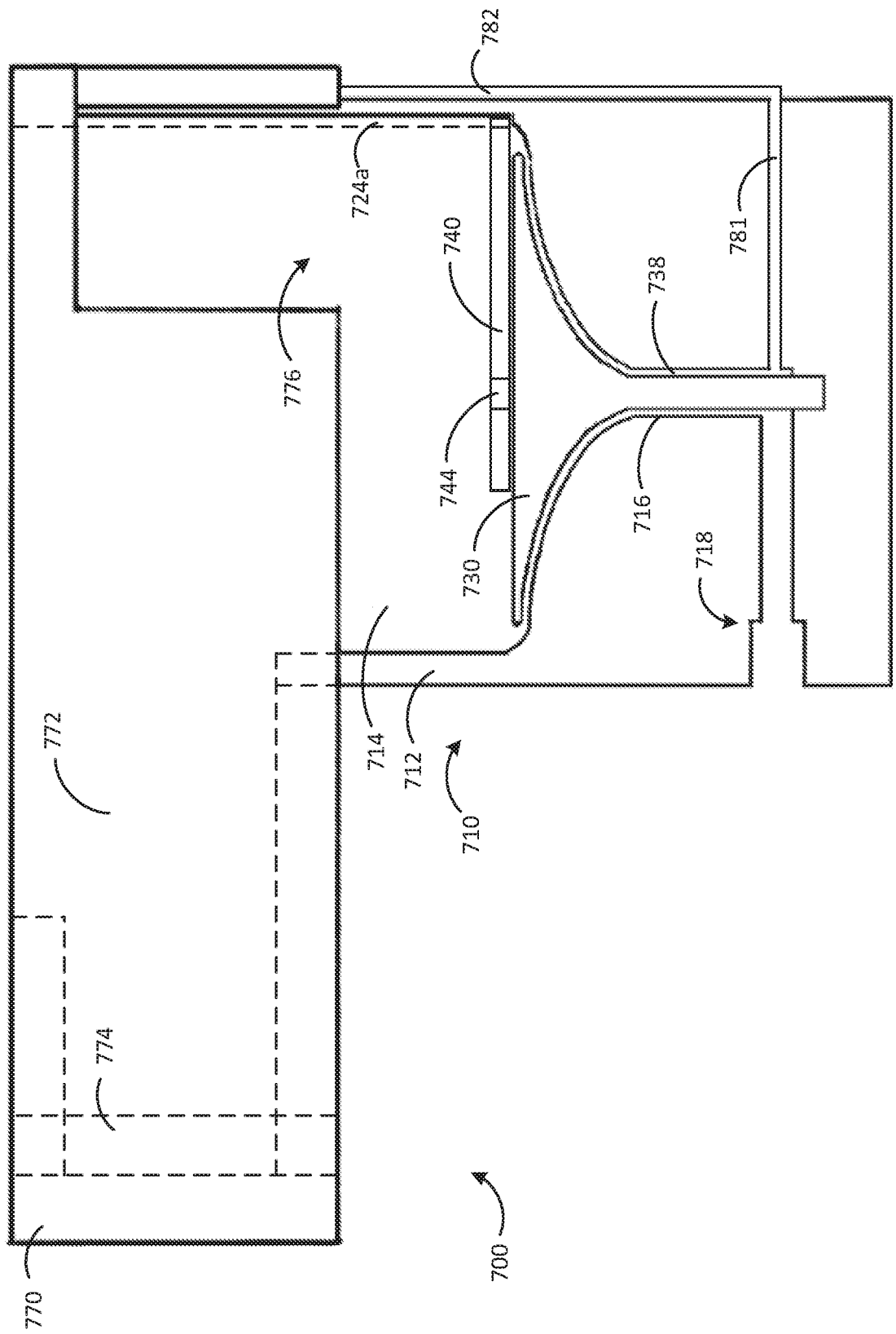
FIG. 7 shows a cross-sectional view of a transfer system including a substrate tub and a process vessel.

FIG. 7 shows a cross-sectional view of a transfer system including a substrate tub and a process vessel. As shown process vessel 700 includes a main chamber 710 having a sidewall 712 defining a cavity 714. As described elsewhere herein (e.g., with respect to the embodiment in FIGS. 1A and 1B), an inlet/outlet port 718 provides fluid communication into the cavity 714 via a flow channel 738 between a sample stage 730 and a neck portion 716 of the main chamber 710. As fluid fills the cavity 714, fluid reaches a cutaway section of the process vessel and enters basin 772 of the substrate tub 770. Fluid can continue to fill the basin 772 until it reaches an overflow drain 774.

Sample guide 740 including aperture 744 is shown positioned on the sample stage 730 within the cavity 714 defined by sidewall 712. As described elsewhere herein one or more guide channels (e.g., 742a) can maintain the lateral position of the sample guide 740 within the process vessel 700 when fluid is introduced into the cavity 714 via inlet/outlet port 718 and flow channel 738.

Cutaway of the substrate tub can provide an area for placing a liquid level sensor along the sidewall 712 of the main chamber 710 in order to measure the level of the fluid in the cavity 714 and/or the basin 772.

Often, when a material of interest is substantially removed from the carrier material, it is desirable to set the material down onto a substrate on which the material is to be utilized. For instance, in an exemplary process, graphene is removed from a copper foil carrier in order to be placed on a silicon substrate for analysis and/or device fabrication.

In some embodiments, a transfer system includes a substrate holder configured to hold and position a substrate to receive a material of interest after a carrier has been sufficiently removed therefrom. In some examples, the substrate holder can be moved from the basin of the substrate tub to a position over the sample stage to receive a material separated from a carrier on a substrate.

The main chamber 710 of FIG. 7 includes a fluid level measurement chamber 782 in fluid communication with the cavity 714 via fluid measurement channel 781. As described elsewhere herein, fluid level measurement chamber 782 can receive fluid such that the fluid level within the fluid level measurement chamber 782 corresponds to the fluid level within the cavity 714. Measurement of the fluid level within the fluid level measurement chamber 782 can be used to determine the level of the fluid within the cavity 714. While shown as being position outside of the sidewall 712 in the embodiment of FIG. 7A, in some examples, fluid level measurement chamber 782 can be positioned within the sidewall 712 or omitted entirely.

Figure 8A:
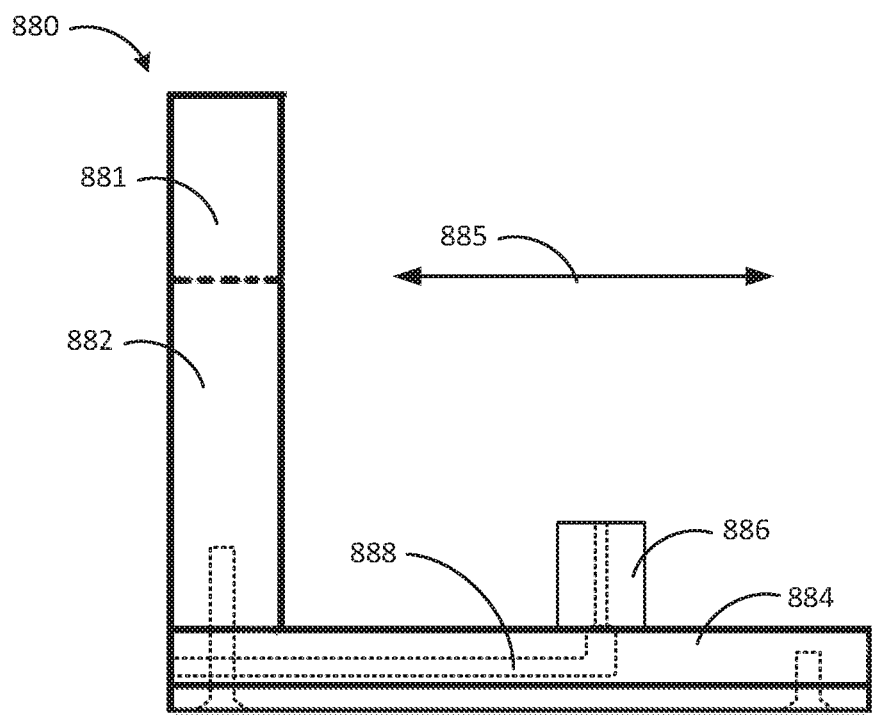
FIG. 8A show an exemplary substrate holder for use with a process vessel.
Figure 8B:
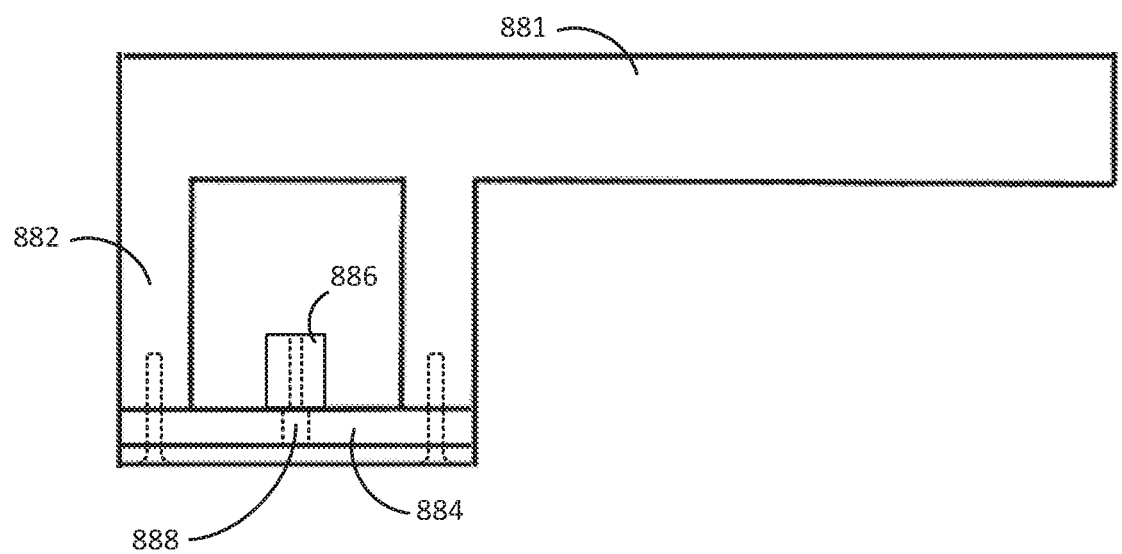
FIG. 8B shows a side elevation view of the substrate holder of FIG. 8A.

FIG. 8A shows an exemplary substrate holder for use with a process vessel. The substrate holder 880 includes an arm 882 supporting a base 884. FIG. 8B shows a side elevation view of the substrate holder of FIG. 8A. A substrate stage 886 is supported by the base 884. In some examples, substrate holder 880 includes one or more mechanisms for holding the substrate in place on the stage 886. Such mechanisms can include one or more clips, magnets, adhesives, or the like. In the illustrated example, a vacuum line 888 extends through the base 884 and stage 886. Vacuum line 888 can be used to hold a substrate securely to the stage 886 via vacuum pressure. Additional components or surface treatments (e.g., including one or more gaskets or compliant surfaces) can be incorporated into the stage 886 to facilitate the vacuum engagement of the substrate holder 880 and the stage 886.

In some examples, substrate stage 886 does not extend from the base 884 (e.g., vertically) of the substrate holder 880. In some such examples, the substrate stage can include an area coplanar with the base 884 or recessed from the base 884 of the substrate holder 880. One or more mechanisms for holding the substrate in place at the substrate stage 886 of the substrate holder, such as a vacuum line (e.g., 888).

In some embodiments, the angle of the substrate on the substrate stage relative to the horizontal plane may be customized and/or adjustable to provide flexibility for controlling the angle at which a material of interest is set down onto the substrate. In some examples, such as shown, parts of the substrate holder 880 can be held together via one or more fasteners, such as screws. Additionally or alternatively, one or more components of the substrate holder can be integrally formed, for example, from a single bulk material, and may omit such fasteners.

With reference to FIGS. 7 and 8A, in some embodiments, substrate holder 880 is positioned in basin 772, and is movable in the direction of arrow 885 shown in FIG. 8A. When moved to the right (in the orientation of FIGS. 7 and 8A), the base 884 with the substrate stage 886 can be positioned into the cavity 714 of the main chamber 710 above the sample stage 730 in order to receive the material of interest. In some examples, the substrate holder 880 is moved into position by motion of a gantry arm 881. In some examples, the arm 881 carrying the substrate holder 880 can be adjustable, for example, for calibrating the position of the substrate holder and substrate stage with respect to the sample guide and aperture. In some embodiments, the arm can include a reinforcing bracket in order to reduce undesired movement and to maintain a constant orientation of the arm relative to the process vessel (e.g., perpendicular).

In some embodiments, a motor, such as a servo motor or a stepper motor, can be used to adjust the position of the substrate holder. In some examples, motor operation can be monitored during use to detect for stalls in the motor, for example, by detecting a back EMF, changes in current draw, or via one or more sensing components, such as a rotary encoder, an accelerometer or the like.

Figure 9A:
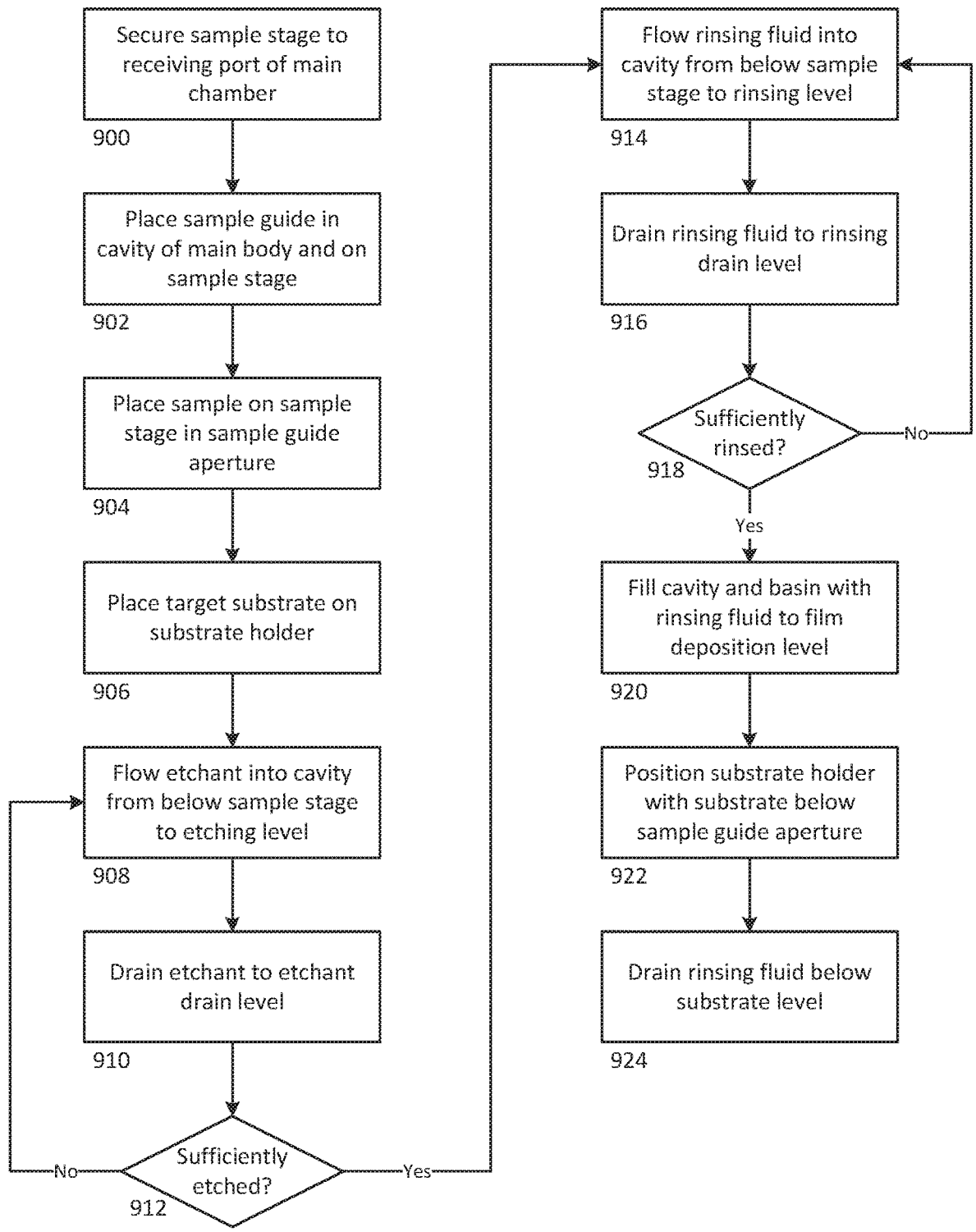
FIG. 9A is a process-flow diagram illustrating exemplary process for transferring a material of interest from a carrier onto a substrate.

FIG. 9A is a process-flow diagram illustrating exemplary process for transferring a material of interest from a carrier onto a substrate.

Step 900 in FIG. 9A includes securing the sample stage (e.g., 130) to the receiving port (e.g., 120) in the main chamber (e.g., 110) in a process vessel (e.g., 100).

Step 902 includes placing a sample guide (e.g., 140) in the cavity (e.g., 114) of the main chamber (e.g., 110). In some examples, this includes inserting tabs (e.g., 542a, 542b, 542c) of the sample guide into respective guide channels (e.g., 324a, 324b, 324c) of the main chamber.

Step 904 includes placing a sample (e.g., a material of interest attached to a carrier) on the sample stage within an aperture (e.g., 544) of the sample guide.

Step 906 includes placing a desired substrate for receiving the sample on the substrate holder. In some examples, attaching the desired substrate to the substrate holder (906) can include placing the desired substrate over a mechanism for securing the substrate to the substrate holder, such as a vacuum line, magnet, etc., and, in some such examples, actuating the mechanism if necessary (e.g., opening a valve to provide a vacuum in a vacuum line).

Step 908 includes flowing an etching fluid into the cavity from below the sample stage to an etching level. The level of the etching fluid can be determined, for example, via a flow meter, a level sensor, or the like as described elsewhere herein. As described, flowing an etching fluid into the cavity can include opening one or more valves (e.g., a reservoir valve associate with a reservoir containing an etching fluid capable of etching the carrier and a fill valve providing fluid communication between a manifold and the inlet/outlet port of the main chamber). With reference to FIG. 1, etching fluid can be introduced into the process vessel 100 very slowly through inlet/outlet port 118, for example, due to adding fluid by gravity and by a precise/slow opening of a fill valve (e.g., 219 in FIG. 2) leading to inlet/outlet port 118. The etching fluid can enter the inlet/outlet port 118 and flow through flow channel 138 around the stem 134 of the sample stage 130 into the cavity 114 of the main chamber 110. In some examples, flow channel 138 promotes laminar flow of the etching fluid into the cavity 114. With reference to FIGS. 1A and 4B, when the etching fluid approaches the top surface of the sample stage 430, the etching fluid can fill the channel 438 of the sample stage 430 to force contact with the sample from underneath the sample. This, in combination with the laminar flow of the etching fluid into the cavity 114, can reduce the likelihood of the etching fluid splashing onto the sample surface that includes the material of interest.

As the etching fluid level rises in the cavity 114, the sample guide 140, along with the sample within the aperture 144, rises with the fluid level, such as shown in FIG. 1B. Etching fluid can be added until the etching fluid reaches a predetermined level.

After providing etching fluid into the cavity (908) step 910 includes draining the etching fluid to an etching fluid drain level. This can be performed, for example, via one or more valves (e.g., fill valve 219 and drain valve 277) to direct the etching fluid to the drain. In some examples, draining the etching fluid (910) is performed after the etching fluid has been present in the system for an amount of time. In various examples, the amount of time can be determined according to a particular operating program (e.g., implemented by the controller opening and closing valves according to pre-programmed instructions, such as instructions programmed by an end user or via factory default instructions) or can be performed manually by a user. In some examples, the etching drain level is above the surface of the sample stage so that, once the carrier is fully etched away from the material of interest, the material of interest is not set down onto the sample stage, but remains floating on the etching fluid at the etching fluid drain level.

At step 912, it can be determined if sufficient etching has occurred. This can be performed, for example, by counting the number of times etching has been performed and comparing the count to a prescribed number of etching steps. In some embodiments, a single etching step is used. Additionally or alternatively, one or more measurements may indicate whether sufficient amount of the carrier has been removed, and if sufficient etching has not been achieved, etching fluid is again applied into the cavity (908) and drained (910) until the amount of etching is considered sufficient.

In some cases, after the etching fluid has been drained, the material of interest, removed from its carrier, remains floating within the aperture (e.g., 144) of the sample guide (e.g., 140) at the etching fluid drain level and is not set down on the sample stage (e.g., 130).

After etching is complete, step 914 includes flowing rinsing fluid, such as deionized water, into the cavity from below the sample stage to a rinsing level. In some examples, the rinsing level is approximately the same as the etching level or higher than the etching level. This can be performed in approximately the same way as etching fluid is provided to the cavity in step 908, wherein fluid is obtained from a reservoir including the rinsing fluid. Flow of the rinsing fluid can be substantially laminar flow in order to prevent damaging the material, for example, due to turbulence.

The process shown in FIG. 9A includes draining the rinsing fluid (916) to a rinsing drain level, for example, via the manifold and drain valve, and determining the sample is sufficiently rinsed (918). Similar to described above with respect to etching, sufficient rinsing can include comparing the number of rinse cycles performed to a prescribed number of rinse cycles or performing a measurement (e.g., a measurement of the remaining etching fluid is present in the rinsing fluid after a rinsing cycle). Rinsing steps 914 and 916 can be repeated until sufficient rinsing has occurred. The rinsing level can be above the surface of the sample stage so that, during draining of the rinsing fluid (916), the remaining material of interest is not set down onto the sample stage.

At step 920, if sufficient rinsing has been performed, the cavity and the basin of the substrate tub can be filled with the rinsing fluid to a deposition level. Similar to described above, the level of the rinsing fluid can be measured using a flow rate sensor, a fluid level sensor, or the like, and compared to a prescribed deposition level. In some embodiments, the deposition level is at a level higher than the top of a substrate stage on a substrate holder when the substrate holder is in a deposition position.

The process includes positioning the substrate holder so that the substrate is below the sample guide aperture (922) and draining the rinsing fluid below the substrate level (924).

As the rinsing fluid is drained, the sample guide and remaining material of interest within the sample guide aperture (after the carrier has been etched away from the sample) that are floating on the fluid surface are lowered within the cavity of the main chamber with the fluid level. Since the fluid level is lowered below the level of the substrate (924) and because the substrate is positioned below the aperture in the sample guide (922), the material of interest floating on the fluid surface in the sample guide aperture will be lowered onto the substrate.

Figure 9B:
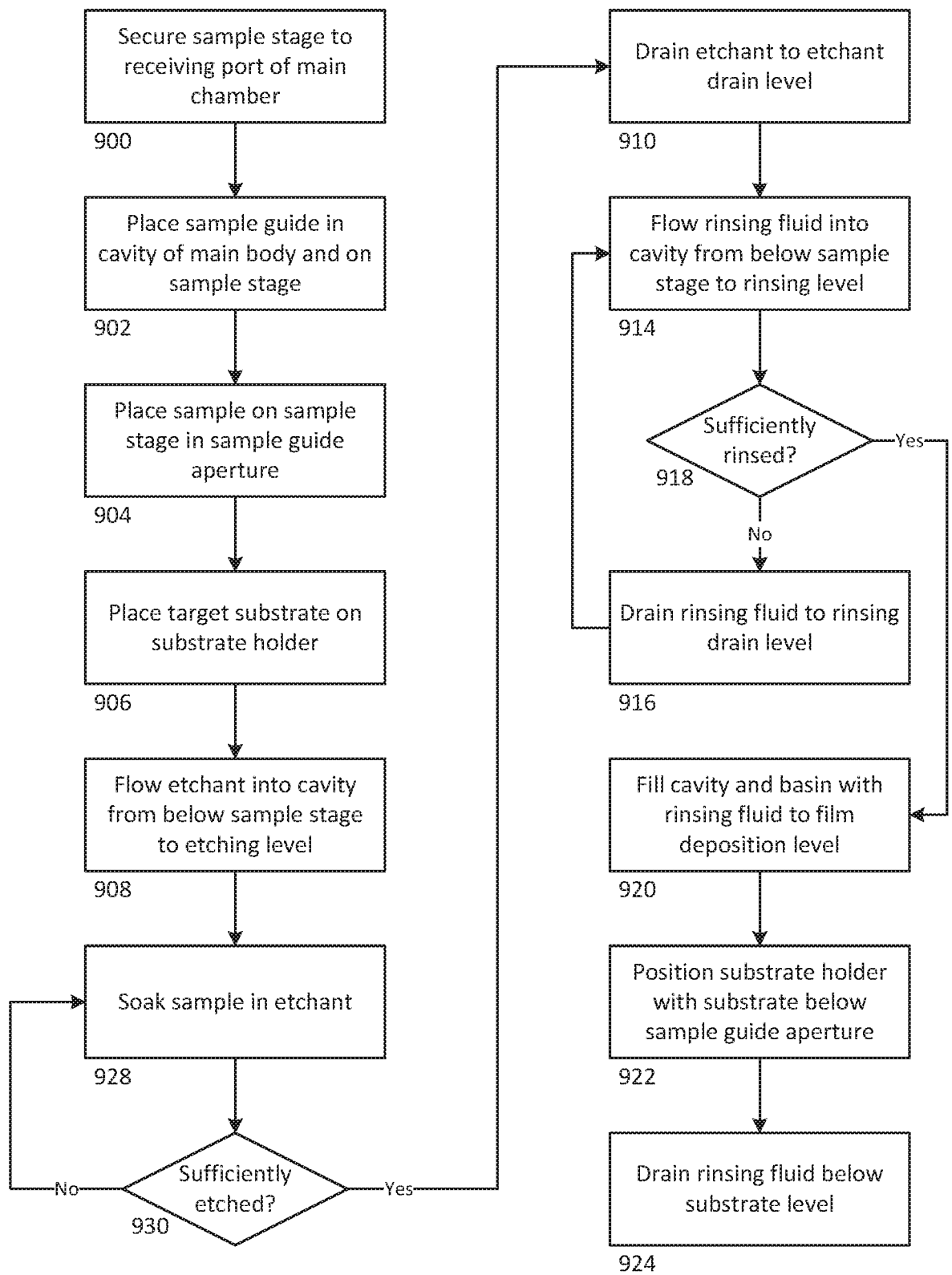
FIG. 9B is a process-flow diagram illustrating another exemplary process for transferring a material of interest from a carrier onto a substrate.

FIG. 9B is a process-flow diagram illustrating another exemplary process for transferring a material of interest from a carrier onto a substrate.

Many steps of FIG. 9B are similar to those described with respect to FIG. 9A, and descriptions of such steps are not repeated. However, in the process of FIG. 9B, after flowing etching fluid into the cavity (908), the sample is soaked in the etching fluid (928) and continues to soak until the carrier has been sufficiently etched (930). In some such examples, determining if a sample has been sufficiently etched comprises soaking the sample in the etching fluid (928) for a predetermined amount of time that should be sufficient to etch away the carrier, for instance, corresponding to a certain known amount of carrier initially present in the sample. Additionally or alternatively, one or more measurements may be made to indicate when sufficient etching has occurred (930).

Similar to the process in FIG. 9A, once sufficient etching has occurred, the etching fluid is drained to the etching fluid drain level (910) and rinsing fluid is provided to the cavity and filled to a rinsing level (914). If the sample has not been sufficiently rinsed (918) the rinsing fluid is drained to the rinsing drain level (916) and fresh rinsing fluid is provided to fill the cavity to the rinsing level (914). Once sufficient rinsing has occurred (918), then the cavity is filled with rinsing fluid to the deposition level (920). As shown, in some examples, once sufficient rinsing has been achieved, a draining step need not be performed prior to filling the cavity to the deposition level.

It will be appreciated that in various embodiments, the processes shown in FIGS. 9A and 9B may be amended to include steps, permute steps, or omit steps. For example, in some embodiments, the steps of securing the sample stage to the main chamber (900) and placing the sample guide in the cavity on the sample stage (902) are not performed. For instance, in some examples, such steps are performed a first time in the factory prior to a first use by a user and are never performed before subsequent uses. Additionally or alternatively, various pre- or post-processing steps, such as a cleaning step to clean the substrate and/or sample prior to use can be performed. For instance, in some examples, one or more reservoirs (e.g., RV1 . . . RVN) can include one or more cleaning fluids, such as those used in the RCA cleaning process. Such cleaning fluids can be provided to the system to clean the sample and/or the substrate prior to deposition and/or the deposited material of interest on the substrate after deposition is performed.

Additionally while various differences are present in the processes of FIGS. 9A and 9B, in some embodiments, such process can be blended. For example, the rinsing/draining/depositing steps generally shown in steps 914, 916, 918, 920, 922, and 924 can be performed in the order shown in either FIGS. 9A and 9B regardless of whether the etching process of FIG. 9A or of 9B is performed. Thus, in various examples, the process of FIG. 9A, the process of FIG. 9B, the etching process of FIG. 9A with the rinsing process of FIG. 9B, or the etching process of FIG. 9B with the rinsing process of FIG. 9A can be performed.

For instance, in general, in some embodiments, determining whether or not sufficient rinsing has been performed (e.g., step 918) can be performed prior to draining the rinsing fluid (e.g., step 916). In some such examples, if sufficient rinsing has not been performed, then the rinsing fluid is drained and refilled (e.g., step 914). If sufficient rinsing has been performed, then, in some examples, the rinsing fluid is drained (e.g., step 916) prior to filling the cavity and basin with rinsing fluid to the deposition level (e.g., step 920), or in other examples, after sufficient rinsing is performed, the draining step (e.g., step 916) can be omitted and additional rinsing fluid can be added to fill the cavity and basin to the deposition level (e.g., step 920).

As described, in some examples, one or more measurements can be performed, for example, to determine the level of fluid in the process vessel and/or to determine whether or not a process (e.g., rinsing or etching) is complete. In some examples, one or more measurements can be used to determine both properties. For example, in some embodiments, a capacitive measurement can be used to determine a fluid level in the process vessel and also can indicate changes in electrical properties of the sample (e.g., whether or not a metallic carrier is present on the sample or has been etched away). Additionally or alternatively, an optical sensor, for example, including an array of optical sensing elements, can be used to sense the fluid level in the process vessel.

While the processes of FIGS. 9A and 9B generally describe methods in which the carrier material is etched away from the sample, other separation techniques to remove the material of interest from the carrier are possible. For instance, in some embodiments, an electrochemical process can be used to separate the material of interest from the carrier. In some such embodiments, the sample stage and/or other components can be equipped with one or more electrodes at which an electrical potential can be applied, for example, via the controller, and one or more reservoirs includes an electrolyte material that can be introduced to the process vessel. During delamination of the material of interest from the carrier, the electrolyte can be introduced into the process vessel in a similar manner as described elsewhere herein, and an electrical potential can be applied at one or more electrodes to delaminate the material of interest from the carrier.

Figure 10A:
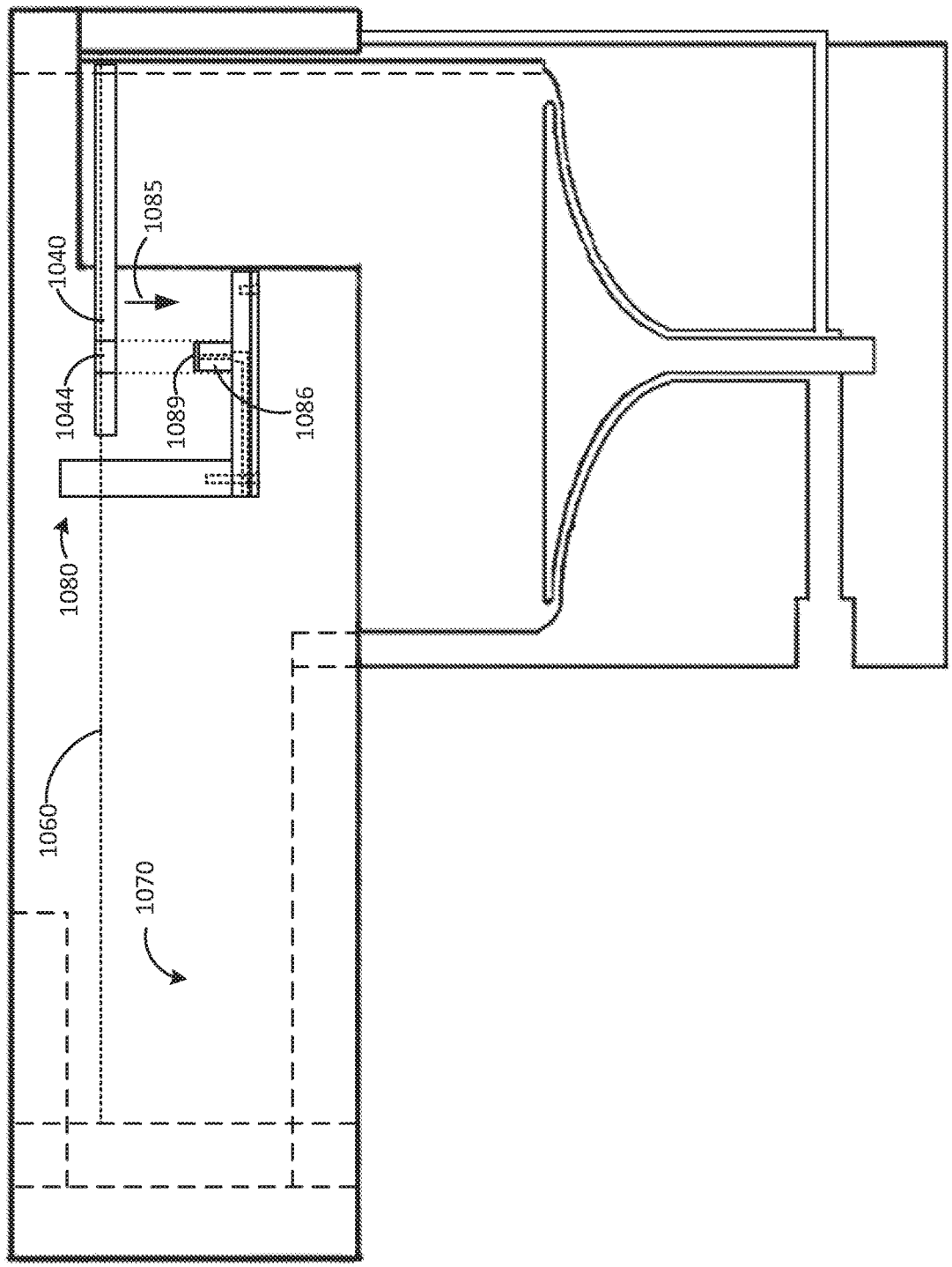
FIG. 10A shows a substrate holder extending into a cavity in a main chamber for receiving a sample from below the sample guide.

FIG. 10A shows a substrate holder extending into a cavity in a main chamber for receiving a sample from below the sample guide. As shown, substrate holder 1080 includes a substrate stage 1086 holding a substrate 1089. The rinsing fluid is raised to a deposition level 1060 to raise the sample guide 1040 above the substrate 1089. The aperture 1044 in the sample guide 1040 is positioned over the substrate stage 1086 and the substrate 1089, for example, by moving the substrate stage 1086 and substrate 1089 from the substrate tub 1070 into a position in alignment with the sample guide 1040, e.g., via motor. Alternatively, in some examples, the sample guide (e.g., including a sample to be deposited within aperture 1044) can be repositioned (e.g., via a motor) relative to a stationary substrate holder 1080 so that the aperture 1044 aligns with the substrate stage 1086. In still further embodiments, both the substrate holder 1080 and the sample guide 1040 can be moved to respective positions such that the aperture 1044 of the sample guide 1040 aligns vertically with the substrate stage 1086.

Figure 10B:
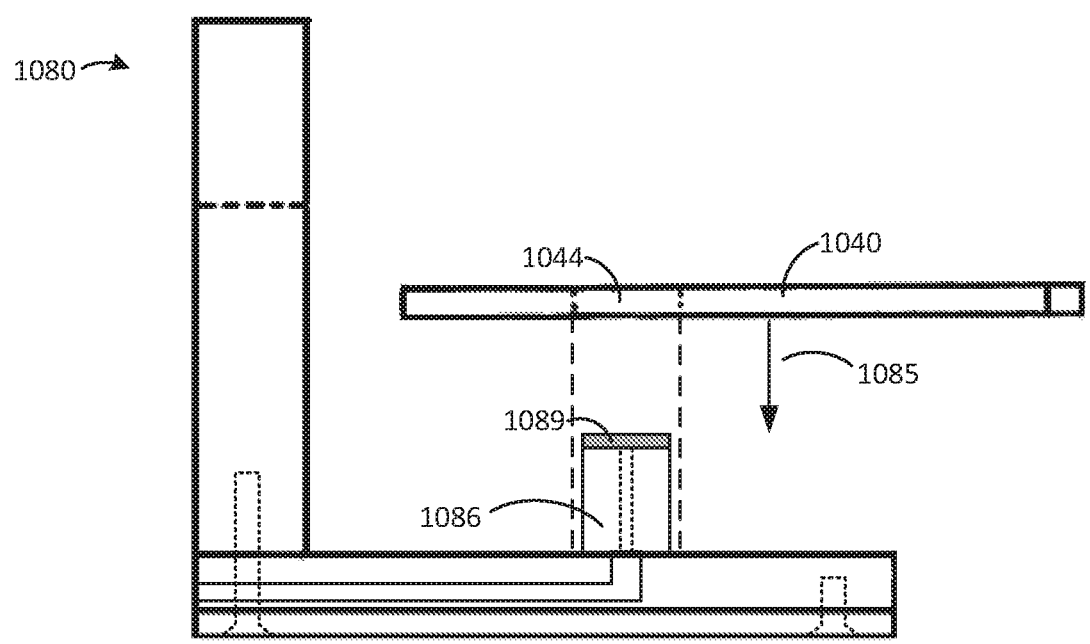
FIG. 10B shows a zoomed-in view of the motion of the sample guide relative to the substrate holder.

When the aperture 1044 of the sample guide 1040 aligns with the substrate stage 1086 and sample guide 1040 is lowered in the direction of arrow 1085 (e.g., by draining the rinsing fluid from the system), substrate 1089 and substrate stage 1086 extend through the aperture 1044 so that the sample contained within the aperture 1044 is placed on the substrate. FIG. 10B shows a zoomed-in view of the motion of the sample guide relative to the substrate holder.

In some embodiments, the lateral dimensions of the substrate stage 1086 closely match the dimensions of the aperture 1044 in the sample guide 1040. For example, in some embodiments, the lateral dimensions of the substrate stage 1086 are smaller than the aperture 1044 such that as the substrate stage 1086 enters the aperture 1044, a meniscus of fluid forms within the aperture 1044 and proximate the sample and the substrate 1089. The meniscus can act to raise the edges of the sample floating on the fluid as it is lowered onto the substrate 1089, which can, combined with surface tension, inhibit or prevent folds or wrinkles from forming in the sample as it is deposited onto the substrate 1089.

In some embodiments, the difference between the width of the substrate stage 1086 and the width of the aperture 1044 can be 10 millimeters (mm) or less in at least one lateral dimension, or 10 mm or less in both lateral dimensions. In some such examples, the difference between the width of the substrate stage 1086 and the width of the aperture 1044 can be 5 mm or less in at least one lateral dimension, or 5 mm or less in both lateral dimensions. In some such examples, the difference between the width of the substrate stage 1086 and the width of the aperture 1044 can be 1 mm or less in at least one lateral dimension, or 1 mm or less in both lateral dimensions. For instance, in one example, the substrate stage 1086 is between approximately 10 mm and 10.5 mm across, while the aperture 1044 in the sample guide 1040 is between approximately 11 mm and 11.5 mm across.

As described elsewhere herein, in some examples, substrate stage does not extend vertically from a base of the substrate holder, and can instead be coplanar therewith or recessed therefrom. In some such examples, similar to described with respect to FIG. 10B, the substrate holder 1080 can be positioned such that the substrate stage is generally aligned with the aperture 1044 of the sample guide 1040. As the sample guide 1040 is lowered, a sample within the aperture 1044 is placed down upon a substrate held on the substrate stage, which aligns with aperture 1044.

Similar to other components of the process vessel described herein, components of the substrate holder can be made from the same or different materials from portions of the process vessel. Such materials are generally chemically resilient materials such as materials described herein. In various examples, such substrate holder components can be machined from bulk material, injection molded, 3D printed, or assembled via one or more other methods.

In some examples, a procedure such as that described with respect to FIG. 9A or FIG. 9B can be controlled via a controller (e.g., 280) in communication with one or more components. For example, the controller can be used to facilitate the filling and draining of the main chamber of the process vessel with the appropriate amounts of prescribed fluids and/or to position the substrate stage as required. For instance, with respect to FIG. 2, controller 280 can be configured to control each of a plurality of reservoir valves RV1 . . . RVN, as well as fill valve 219 and drain valve 277, and can receive signals from a flow sensor and/or fluid level sensor 282 indicative of the amount of fluid in the main chamber.

The controller can be programmed or otherwise configured with one or more processing routines that prescribe various fill and drain events, such as filling the main chamber with an etching fluid to an etching level a prescribed number of times, then filling the main chamber with a rinsing fluid to a rinsing level a prescribed number of times. Such routines can be stored in a memory, which can be integral with or separate from the controller. Additionally or alternatively, the controller can be programmed or otherwise configured with one or more processing routines corresponding to positioning of the substrate stage relative to the sample guide such as described elsewhere herein, for example, during a deposition process. Such control can include, for example, controlling a motor configured to move the substrate stage between first and second positions.

In some embodiments, systems can include a user interface in communication with the controller. The user interface can include one or more buttons, knobs, switches, touchscreens, or other components by which a user may input signals to the controller. In some such examples, a user may adjust and/or create one or more processing routines, and/or choose to execute or schedule for execution one or more routines from a list of available routines. For example, a user may choose to initiate or otherwise schedule a graphene deposition corresponding to a sample of a graphene material on a copper foil carrier. The controller may then execute a routine in which an etching fluid is provided from a reservoir a prescribed number of times to remove the copper foil from the graphene, and then the rinsing fluid (e.g., deionized water) is provided from a reservoir a prescribed number of times to thoroughly rinse the remaining etching fluid from the graphene sample. The rinsing fluid can then be used to raise the graphene above the level of the substrate holder, which can be moved into position beneath the graphene. The rinsing fluid can be drained to deposit the graphene on the substrate as shown, for example, in FIGS. 10A and 10B.

In various embodiments, a user may initiate one or more individual steps, such as an etch step, a rinse step, a deposition step, a drain step, or the like via the user interface.

The controller can be embodied in a variety of ways. For instance, exemplary controllers can include one or more stand-alone computers, processors, microcontrollers, microprocessors, application-specific integrated circuits (ASICs), field-programmable gate arrays (FPGAs), combinations thereof, or the like. In some examples, the controller can include or otherwise be in communication with a memory configured to store instructions for causing the controller to perform one or more functions. Additionally or alternatively, in some embodiments, the controller includes appropriate interfacing structure for interfacing with a plurality of components, such as an appropriate interface for controlling valves (e.g., RV1 . . . RVN, 219, etc.) and/or receiving data from a sensor (e.g., 282).

FIGS. 11A-11F show an example process of placing a sample on a substrate.

Figure 11A:
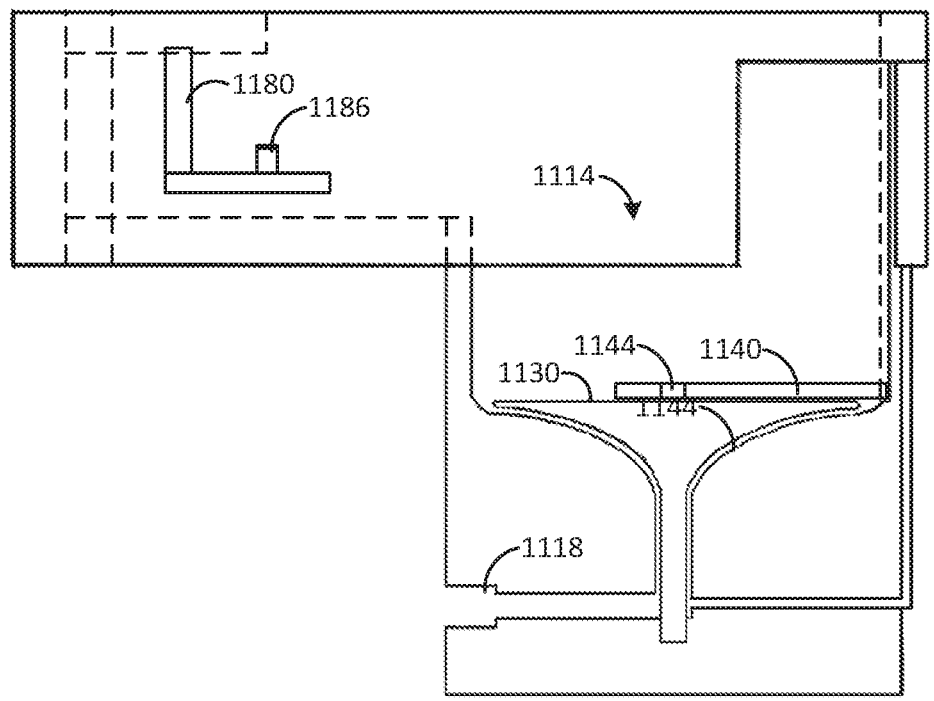
FIGS. 11A-11F show an example process of placing a sample on a substrate.

FIG. 11A shows a sample guide 1140 positioned on sample stage 1130. A sample on a carrier is within the aperture 1144 of the sample guide 1140. Substrate holder 1180 is in a first position. Substrate holder 1180 includes a substrate stage 1186 supporting a substrate.

Figure 11B:
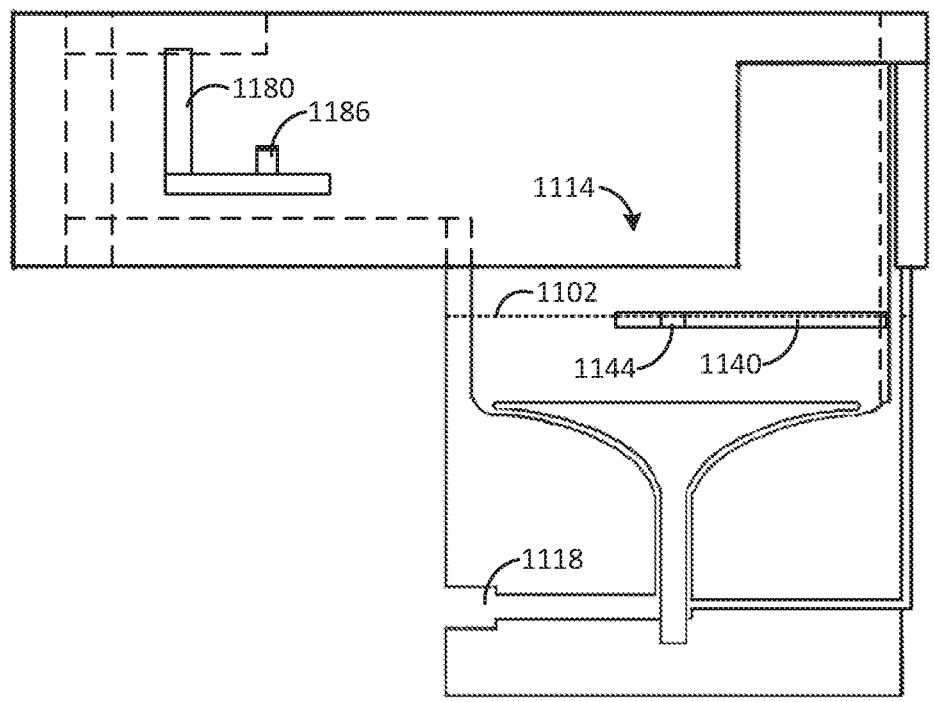

FIG. 11B shows an etching process, in which an etching fluid is at an etching level 1102 within the cavity 1114. Sample guide 1140 floats on the etching fluid while the etching fluid contacts the carrier on the underside of the sample within the aperture 1144. The etching fluid can be introduced to the cavity 1114 via inlet/outlet port 1118. The etching fluid can be drained from the cavity 1114 via the inlet/outlet port 1118 to an etching fluid drain level such that the sample guide 1140 is lowered toward the sample stage 1130. As described herein, the etching process can be performed a plurality of times (e.g., transitioning between FIGS. 11A and 11B) until the carrier is removed from the sample. Additionally or alternatively, the etching fluid can remain in the cavity 1114 until the carrier is removed.

Figure 11C:
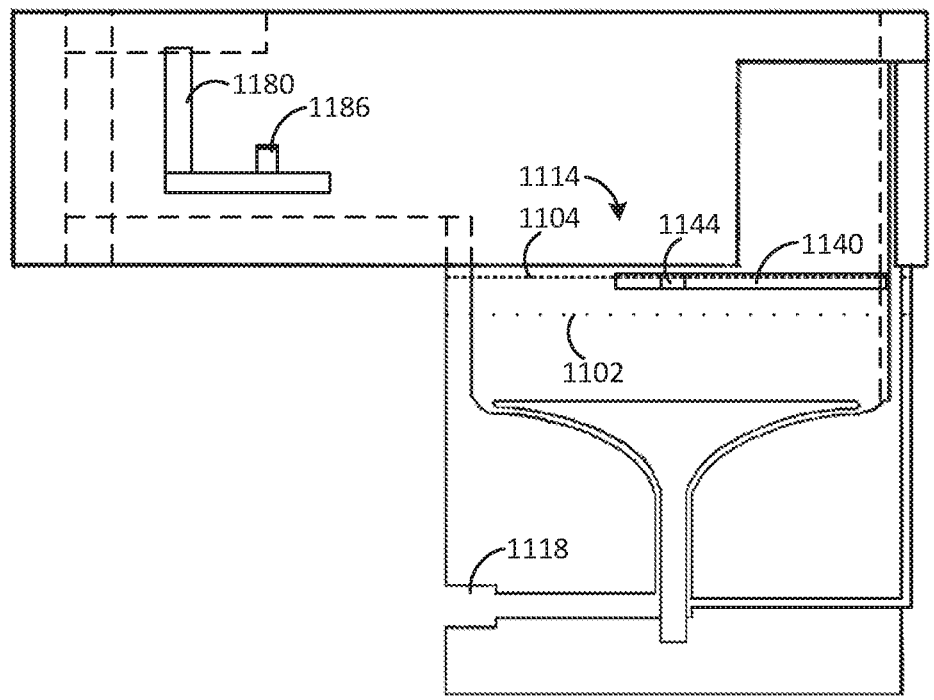

FIG. 11C shows a rinsing process, in which a rinsing fluid is at rinsing level 1104 within the cavity 1114. In the illustrated example, rinsing level 1104 is higher than the etching level 1102. Sample guide 1140 floats on the rinsing fluid while the rinsing fluid contacts the sample within the aperture 1144. The rinsing fluid can be introduced to the cavity 1114 via inlet/outlet port 1118. The rinsing fluid can be drained from the cavity 1114 via the inlet/outlet port 1118 to a rinsing fluid drain level such that the sample guide 1140 is lowered toward the sample stage 1130. As described herein, the rinsing process can be performed a plurality of times (e.g., transitioning between FIGS. 11A and 11C) until remaining etching fluid is sufficiently rinsed from the sample.

In some examples, the etching fluid drain level and the rinsing fluid drain level are sufficiently high within the cavity such that, as the sample guide 1140 is lowered toward the sample stage, the sample within the aperture 1144 does not contact the sample stage, reducing the risk of damaging the sample or inadvertently depositing the sample onto the sample stage.

Figure 11D:
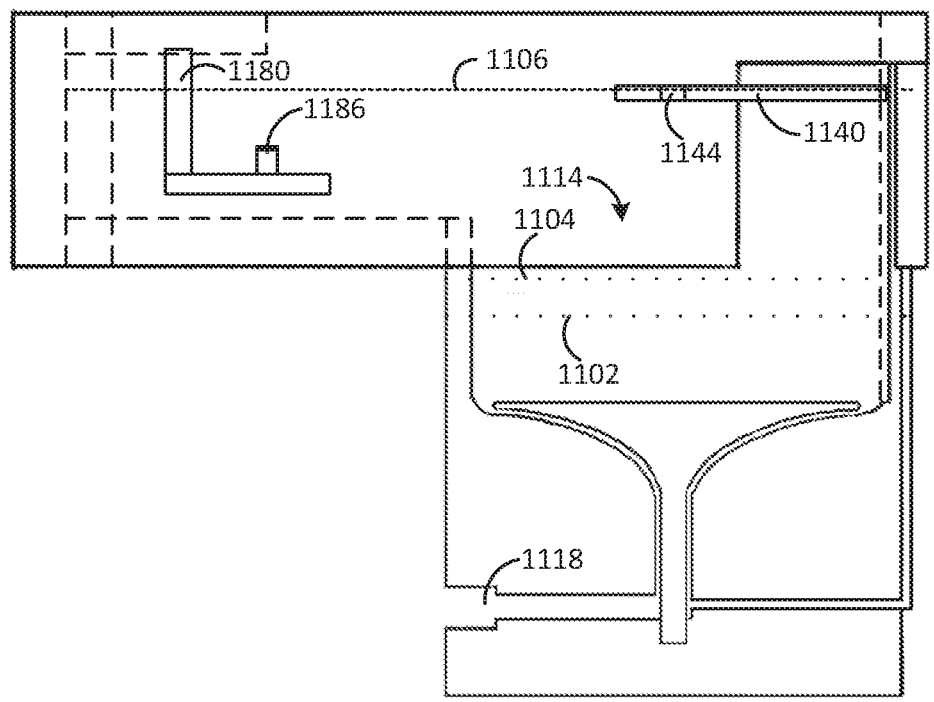
Figure 11E:
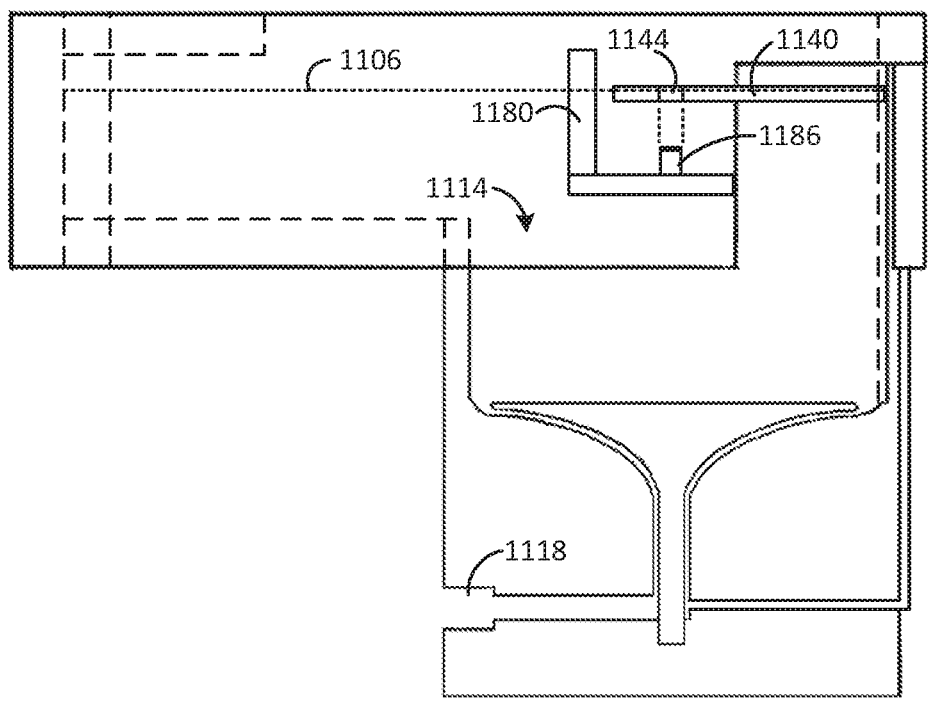
Figure 11F:
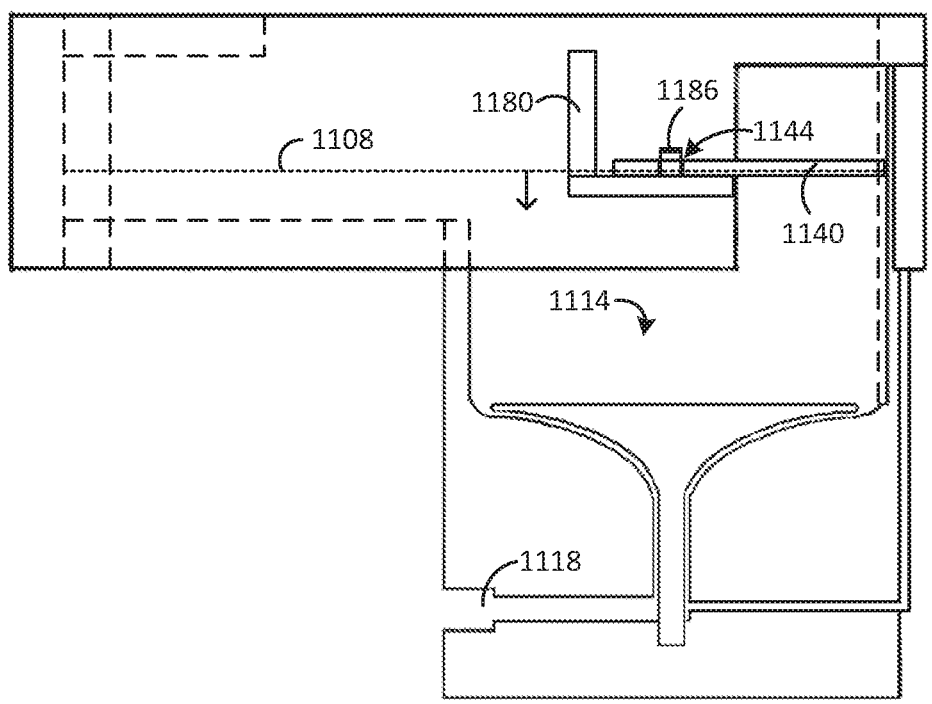

FIGS. 11D-11F show a deposition process. FIG. 11D shows a rinsing fluid at deposition level 1106 within the cavity 1114. In the illustrated example, deposition level 1106 is higher than the rinsing level 1104 and the etching level 1102. Similar to described elsewhere herein, the rinsing fluid can be introduced to the cavity 1114 via inlet/outlet port 1118. Sample guide 1140 floats on the rinsing fluid and is raised to a level higher than the substrate stage 1186 on substrate holder 1180, and the sample floats on the rinsing fluid within the aperture 1144.

FIG. 11E shows the substrate holder 1180 in a second position beneath the sample guide while the sample guide floats on the rinsing fluid at the deposition level 1106. When the substrate holder is in the second position, the substrate stage 1186 aligns with the aperture 1144 in the sample guide 1140.

FIG. 11F shows the substrate holder 1180 in the second position while the rinsing fluid is drained from the cavity 1114. The rinsing fluid can be drained from the cavity 1114 via the inlet/outlet port 1118 such that the sample guide 1140 is lowered within the cavity. As shown, as the sample guide 1140 lowers with the fluid level 1108, substrate stage 1186 including a substrate extend through the aperture 1144 of the sample guide such that the sample within the aperture is received via the substrate.

Several advantages and improvements are realized in view of embodiments of the invention described herein. For instance, a controller-guided process for removing a carrier from a sample and depositing a material of interest on a desired substrate reduces the number of times a user must physically manipulate the sample to perform etching, rinsing, and depositing steps. This reduces the risk and/or amount of damage to the material of interest. Additionally, the gentle and gradual filling and draining of the main chamber and/or introducing the fluid to the bottom-side of the sample via the channel in the sample stage reduces the likelihood that etching fluid undesirably contacts the material of interest rather than exclusively or substantially exclusively contacting the carrier that is to be etched away. Additionally, minimal turbulence reduces the risk of damaging the material of interest due to violent fluid flow contacting the sample/material.

Such gentle and gradual fluid fill is facilitated by one or more of: a fill valve (e.g., 219) having a slow turn-on flow rate to slowly introduce fluid into the main chamber, a narrow flow channel (e.g., 138) providing communication from the inlet/outlet port (e.g., 118) into the cavity (e.g., 114) of the main chamber, and utilizing gravity as a mechanism for transporting fluid from a reservoir into the main chamber. One or more such features, and in some embodiments, each of these features in combination, can induce laminar flow or substantially laminar flow of fluid into the cavity of the main chamber.

While described often with respect to two-dimensional materials (e.g., graphene), it will be appreciated that similar systems and methods can be used for any of a variety of sample types including materials to be separated from a carrier material. For instance, other lower-dimensional materials (e.g., nanowires, nanoparticles, etc.), thin films, or other materials of interest included on a carrier that is to be removed can be processed via systems and methods similar to those described herein to separate the material of interest from the carrier.

Various embodiments have been described. Such examples are non-limiting, and do not define or limit the scope of the invention in any way.

The invention claimed is:

1. A method for transferring a sample from a carrier to a substrate comprising:
   receiving a carrier carrying a sample onto a platform portion of a stage and within an aperture of a sample guide resting on the platform portion of the stage, the stage being positioned within a main chamber;
   performing a carrier removal process to remove the sample from the carrier comprising:
      introducing an etching fluid into the main chamber from below the stage until the etching fluid reaches an etching level, wherein the etching fluid contacts the underside of the carrier within the aperture of the sample guide; and
      draining the etching fluid from the main chamber to an etching fluid drain level; wherein
      the carrier removal process substantially removes the carrier from the sample such that the sample remains within the aperture of the sample guide;
   performing a rinsing process comprising:
      introducing a rinsing fluid into the main chamber from below the stage until the rinsing fluid reaches a rinsing level, wherein the rinsing fluid contacts the underside of the carrier within the aperture of the sample guide; and
      draining the rinsing fluid from the main chamber to a rinsing fluid drain level; and
   performing a sample deposition process comprising:
      introducing a deposition fluid into the main chamber from below the stage until the deposition fluid reaches a deposition level, wherein the deposition fluid rising to the deposition level raises the sample guide to a level higher than a substrate stage holding a substrate;
      aligning the substrate stage holding the substrate with the sample guide such that the substrate is below the deposition level of the deposition fluid and is positioned beneath the aperture in the sample guide; and
      draining the deposition fluid from the main chamber such that, as the deposition fluid drains, the sample guide descends relative to the substrate holder and the sample within the aperture of the sample guide descends to the substrate held by the substrate stage.

2. The method of claim 1, wherein, during the sample deposition process, as the deposition fluid is drained from the main chamber, the substrate holder and substrate travel through the aperture in the sample guide and the sample contacts the substrate.

3. The method of claim 1, wherein the deposition fluid comprises a same fluid as the rinsing fluid.

4. The method of claim 1, wherein aligning the substrate stage with the sample guide comprises positioning the substrate stage below the sample guide via movement of the substrate stage.

5. The method of claim 1, wherein the carrier removal process comprises introducing the etching fluid into the main chamber and draining the etching fluid from the main chamber a plurality of times.

6. The method of claim 1, wherein the rinsing process comprises introducing the rinsing fluid into the main chamber and draining the rinsing fluid from the main chamber a plurality of times.

7. The method of claim 1, wherein introducing the etching fluid into the main chamber comprises opening a valve such that gravity causes the etching fluid to enter the main chamber from below the stage.

8. The method of claim 1, wherein introducing the rinsing fluid into the main chamber comprises opening a valve such that gravity causes the rinsing fluid to enter the main chamber from below the stage.

9. The method of claim 1, wherein positioning the substrate stage beneath the sample guide comprises actuating a motor to move the substrate stage from a first position into a second position, wherein
   in the first position, the substrate stage does not impede vertical movement of the sample guide; and
   in the second position, the substrate stage aligns vertically with the aperture in the sample guide.

10. The method of claim 1, wherein the deposition level is higher than the rinsing level and the etching level.

11. The method of claim 1, wherein the rinsing fluid is deionized water.

12. The method of claim 1, wherein the sample comprises a two-dimensional material.

13. The method of claim 12, wherein the sample comprises graphene and the carrier comprises copper.

14. A system for transferring a material from a carrier to a substrate comprising:
   a process vessel including a main chamber having a cavity therein defined by a sidewall;
   a sample stage having a platform portion, the platform portion being exposed to the cavity in the main chamber of the process vessel;
   a flow channel in fluid communication with the cavity of the main chamber;
   a fluid interface in fluid communication with the flow channel such that
      (i) fluid from one or more fluid sources can be introduced into the main chamber via the fluid interface and the flow channel and
      (ii) fluid can be drained from the main chamber via the fluid interface and the flow channel;
   a sample guide positioned in the cavity of the main chamber and comprising an aperture; and
   a substrate holder having a substrate stage, the substrate holder being movable between a first position and a second position; wherein
      when the substrate holder is in the first position, the substrate holder does not block vertical motion of the sample guide within the cavity; and when the substrate holder is in the second position, the substrate stage of the substrate holder aligns with the aperture in the sample guide.

15. The system of claim 14, wherein:
the sidewall of the process vessel includes one or more guide channels formed therein; and
the sample guide comprises one or more tabs extending from the periphery of the sample guide, each of the one or more tabs interfacing with a corresponding one of the one or more guide channels in the sidewall of the process vessel to limit lateral motion of the sample guide within the cavity while permitting vertical motion of the sample guide within the cavity.

16. The system of claim 14, wherein:
the process vessel includes a neck portion extending from the cavity;
the sample stage includes a stem portion extending away from the platform portion, the stem portion being generally positioned within the neck portion of the process vessel; and
the flow channel is formed between the stem portion of the sample stage and the neck portion of the process vessel.

17. The system of claim 14, further comprising a plurality of fluid reservoirs, wherein each fluid reservoir of the plurality of fluid reservoirs is configured to hold a particular fluid for use in a particular process.

18. The system of claim 14, wherein the sample stage further comprises one or more transport channels extending below a surface of the sample stage and extending at least partially across the surface of the sample stage, wherein the transport channel is configured to transport fluid towards a center of the sample stage and beneath the sample guide.

19. The system of claim 14, wherein the fluid interface comprises a manifold and an inlet/outlet port providing fluid communication between the manifold and the flow channel, the manifold comprising:
a first reservoir valve;
a second reservoir valve;
a fill valve in fluid communication with the inlet/outlet port; and
a drain valve; wherein
when the first reservoir valve and the fill valve are open, a flow path exists between the first reservoir valve, the manifold, the fill valve, the inlet/outlet port, the flow channel, and the main chamber;
when the second reservoir valve and the fill valve are open, a flow path exists between the second reservoir valve, the manifold, the fill valve, the inlet/outlet port, the flow channel, and the main chamber; and
when the drain valve and the fill valve are open, a flow path exists between the main chamber, the flow channel, the inlet/outlet port, the fill valve, the manifold, and the drain valve.

20. The system of claim 19, further comprising:
a controller in communication with each of the first reservoir valve, the second reservoir valve, the fill valve, and the drain valve, the controller being configured to selectively open and close each of the first reservoir valve, the second reservoir valve, the fill valve, and the drain valve;
a first reservoir comprising an etching fluid, the first reservoir being in selective fluid communication with the manifold via the first reservoir valve; and
a second reservoir comprising a rinsing fluid, the second reservoir being in selective fluid communication with the manifold vis the second reservoir valve.

21. The system of claim 20, wherein the controller is configured to control the first reservoir valve, the second reservoir valve, the fill valve, and the drain valve to place the system into any of:
an etching configuration, wherein:
the first reservoir valve is open,
the second reservoir valve is closed,
the drain valve is closed, and
the fill valve is open, such that
the first reservoir comprising the etching fluid is in fluid communication with the cavity of the main chamber via the first reservoir valve, the manifold, the fill valve, the inlet/outlet port, and the flow channel so that the etching fluid is provided to the cavity of the main chamber;
a rinsing configuration, wherein
the first reservoir valve is closed,
the second reservoir valve is open,
the drain valve is closed, and
the fill valve is open, such that
the second reservoir comprising the rinsing fluid is in fluid communication with the cavity of the main chamber via the second reservoir valve, the manifold, the fill valve, the inlet/outlet port, and the flow channel so that the rinsing fluid is provided to the cavity of the main chamber; and
a drain configuration, wherein
the first reservoir valve is closed,
the second reservoir valve is closed,
the drain valve is open, and
the fill valve is open, such that
the cavity of the main chamber is in fluid communication with a drain via the flow channel, the inlet/outlet port, the fill valve, the manifold, and the drain valve so that fluid in the cavity of the main chamber flows from the cavity to the drain.

22. The system of claim 21, wherein the first reservoir and the second reservoir are positioned higher than the cavity of the main chamber such that:
when the system is in the etching configuration, etching fluid flows from the first reservoir into the cavity of the main chamber due to gravity and without requiring a pump; and
when the system is in the rinsing configuration, rinsing fluid flows from the second reservoir into the cavity of the main chamber due to gravity and without requiring a pump.

23. The system of claim 21, wherein the controller is configured to:
perform an etching process comprising:
placing the system in the etching configuration so that a predetermined amount of etching fluid is provided to the cavity of the main chamber from the first reservoir, the predetermined amount of etching fluid being at least enough etching fluid so that the etching fluid in the cavity rises above the platform portion of the sample stage; and
placing the system in the drain configuration such that the etching fluid drains from the cavity of the main chamber; and
perform a rinsing process comprising:
placing the system in the rinsing configuration so that a predetermined amount of rinsing fluid is provided to the cavity of the main chamber from the second reservoir, the predetermined amount of rinsing fluid being at least enough rinsing fluid so that the rinsing fluid in the cavity rises above the platform portion of the sample stage; and placing the system in the drain configuration such that the rinsing fluid drains from the cavity of the main chamber.

24. The system of claim 23, further comprising a motor in communication with and controllable by the controller, the motor being configured to move the substrate holder between the first position and the second position, and wherein the controller is configured to perform a deposition process, comprising:

placing the system in the rinsing configuration until a second predetermined amount of rinsing fluid is provided to the cavity of the main chamber from the second reservoir, the second predetermined amount of rinsing fluid being at least enough rinsing fluid so that the sample guide rises within the cavity to a height that is above the substrate stage on the substrate holder;

moving, via the motor, the substrate holder from the first position to the second position; and placing the system in the drain configuration such that the rinsing fluid drains from the cavity of the main chamber.

25. The system of claim 24, wherein the controller is configured to:

repeat the etching process a plurality of times;

after repeating the etching process a plurality of times, repeating the rinsing process a plurality of times; and performing the deposition process after repeating the rinsing process a plurality of times.

26. The system of claim 23, further comprising a liquid level sensor in communication with the controller, and wherein providing the predetermined amount of the etching fluid comprises:

measuring the level of the etching fluid in the cavity via the liquid level sensor while the system is in the etching configuration until a detected level of etching fluid reaches a predetermined threshold corresponding to the predetermined amount of etching fluid; and providing the predetermined amount of the rinsing fluid comprises measuring the level of the rinsing fluid in the cavity via the liquid level sensor while the system is in the rinsing configuration until a detected level of rinsing fluid reaches a predetermined threshold corresponding to the predetermined amount of rinsing fluid.

27. The system of claim 26, wherein the predetermined amount of rinsing fluid is greater than the predetermined amount of etching fluid.

28. The system of claim 26, wherein the liquid level sensor comprises an optical sensor.

* * * * *